US00RE38152E

(19) United States
(12) Reissued Patent
Ohara

(10) Patent Number: US RE38,152 E
(45) **Date of Reissued Patent: *Jun. 24, 2003**

(54) LOGIC SYNTHESIS METHOD AND SEMICONDUCTOR INTEGRATED CIRCUIT

(75) Inventor: Kazutake Ohara, Ibaraki (JP)

(73) Assignee: Matsushita Electric Industrial Co., Ltd., Osaka (JP)

( * ) Notice: This patent is subject to a terminal disclaimer.

(21) Appl. No.: 09/656,040

(22) Filed: Sep. 8, 2000

Related U.S. Patent Documents

Reissue of:
(64) Patent No.: 5,517,132
Issued: May 14, 1996
Appl. No.: 08/375,413
Filed: Jan. 18, 1995

U.S. Applications:
(62) Division of application No. 09/076,703, filed on May 13, 1998, now Pat. No. Re. 37,475.

(30) Foreign Application Priority Data

Jan. 19, 1994 (JP) ..... 6-004024

(51) Int. Cl.[7] ..... H03K 19/0175
(52) U.S. Cl. ..... 326/80; 326/41
(58) Field of Search ..... 326/80–81, 38, 326/40–41, 46–47, 101; 327/202–203, 333

(56) References Cited

U.S. PATENT DOCUMENTS 3,950,636 A 4/1976 Dao
4,080,539 A * 3/1978 Stewart ..... 326/81
4,477,740 A 10/1984 Takeda (List continued on next page.)

FOREIGN PATENT DOCUMENTS

EP 0 664 517 7/1995
JP 4-96369 2/1992
JP 4-253366 9/1992
JP 4-288865 10/1992
JP 5-067963 3/1993
JP 5-129930 5/1993
JP 5-299624 11/1993
WO WO 86/02792 5/1986

OTHER PUBLICATIONS

Mou et al., "'Overturned–Stairs' Adder Trees and Multiplier Design" IEEE Transactions on Computers, 41 (1992), No. 8, New York, pp. 940–948.

(List continued on next page.)

*Primary Examiner*—Michael Tokar
*Assistant Examiner*—James H Cho
(74) *Attorney, Agent, or Firm*—McDermott, Will & Emery

(57) ABSTRACT

A semiconductor integrated circuit of registers and combinational logic circuits connected between the registers is generated by a top-down design technique. When performing the logic synthesizing of such a semiconductor integrated circuit by making use of data of register transfer level, a combinational logic circuit with a critical path is driven with power from a high-voltage source, a combinational logic circuit without a critical path is driven with power from a low-voltage source, and a level converter capable of converting an input signal of low voltage level into a high-voltage-level output is arranged in a register located upstream of a combinational logic circuit with a critical path. Compared with a technique in which only critical paths are driven with power from a high-voltage source, it becomes easier to determine where to arrange level converters. Additionally, the number of level converters required can be reduced, thereby facilitating design work. Each combinational logic circuit with a critical path is driven by the high-voltage source, so that the power consumption increases in comparison with a case where only critical paths are driven by the high-voltage source. However, the ratio of the number of combinational logic circuits with a critical path to the total number of combinational logic circuits contained in the whole semiconductor integrated circuit is negligible, and other combinational logic circuits without a critical path are driven by the low-voltage source. The entire power consumption of the semiconductor integrated circuit can be reduced.

12 Claims, 27 Drawing Sheets

U.S. PATENT DOCUMENTS

| | | | | |
|---|---|---|---|---|
| 4,713,796 | A | | 12/1987 | Ogiue et al. |
| 4,785,297 | A | * | 11/1988 | Sekiya ..... 327/202 |
| 4,978,633 | A | | 12/1990 | Seefeldt et al. |
| 5,115,408 | A | | 5/1992 | Darley et al. |
| 5,119,314 | A | | 6/1992 | Hotta et al. |
| 5,175,693 | A | | 12/1992 | Kurosawa et al. |
| 5,187,385 | A | | 2/1993 | Koike |
| 5,218,551 | A | | 6/1993 | Agrawal et al. |
| 5,245,224 | A | | 9/1993 | Suzuki et al. |
| 5,300,835 | A | | 4/1994 | Assar et al. |
| 5,311,083 | A | | 5/1994 | Wanlass |
| 5,352,942 | A | | 10/1994 | Tanaka et al. |
| 5,404,312 | A | | 4/1995 | Tawada |
| 5,408,138 | A | | 4/1995 | Khosravi et al. |
| 5,416,718 | A | | 5/1995 | Yamazaki |
| 5,432,467 | A | * | 7/1995 | Reddy ..... 326/81 |
| 5,438,524 | A | | 8/1995 | Komoda |
| 5,541,849 | A | | 7/1996 | Rostoker et al. |
| 5,557,533 | A | | 9/1996 | Koford et al. |
| 5,594,368 | A | | 1/1997 | Usami ..... 326/80 |
| 5,670,905 | A | | 9/1997 | Keeth et al. |
| 5,680,064 | A | | 10/1997 | Masaki et al. |

OTHER PUBLICATIONS

Kojima et al., "Half–Swing Clocking Scheme for 75% Power Saving in Clocking Circuitry", 1994 Symposium on VLSI Circuits Digest of Technical Papers, pp. 23–24.

Goodby et al., "A High–Level Synthesis Methodology for Low–Power VLSI Design", 1994 IEEE Symposium on Low Power Electronics, pp. 48–49.

Usami et al., "Clustered Voltage Sealing Technique for Low–Power Design", ISLPD 1995, pp. 3–8.

Goodby et al., "Microarchitectural Synthesis of Performance–Constrained, Low–Power VLSI Designs", IEEE Computer Soc. Press, 1994, pp. 323–326.

Chandrakasan et al., "Optimizing Power Using Transformations", IEEE Transactions on Computer–Aided Design of Integrated Circuits and Systems, vol. 14, No. 1, 1995, pp. 12–31.

Hill et al., "Digital Systems: Hardware Organization and Design", 2nd Edi., 1978, p. 257.

Taub et al., "Digital Integrated Electronics", 1977, McGraw–Hill, p. 246.

Wecker et al., "CALLAS—a System for Automatic Digital Synthesis", Informatik Forschung und Entwicklung, (1989) West Germany, vol. 4, No. 1, pp. 37–54.

De Man et al., "Cathedral–II: a silicon compiler for digital signal processing", IEEE Design & Test of Computers, (Dec. 1986), vol. 3, No. 6, pp. 13–25.

E.J. McCluskey, "Logic Design Principles", (1986), Prentice–Hall pp. 439 and 440.

* cited by examiner

Fig.10

```
module  demo4(clk,r,q);
 input          clk,r;
 output [3:0]   q;
 wire [3:0]     qx;
 reg [3:0]      q;

 function [3:0] fq;
 input          r;
 input [3:0]    q;

 if (r)
     fq = 4'h0;
 else
     if (q < 4'd9)
         fq = q + 1'b1;
     else
           ;

 endfunction

 assign  qx = fq(r,q);

 always @(posedge clk)
     q = qx;

 endmodule
```

Fig.11

```
module demo4 ( clk, r, q );
output [3:0] q;
input clk, r;
    wire net7, net8, net9, net10, n60, n51, n52, n53, n54, n55, n56, n57, n58,
        n59;
    MD40C \q_reg[0] ( .NQ(net10), .Q(q[0]), .CK(clk), .D(n60) );
    MD40C \q_reg[1] ( .NQ(net9), .Q(q[1]), .CK(clk), .D(n59) );
    MC22E U20 ( .Y(n59), .A(n60), .B(n56), .S(net9) );
    MC11E U21 ( .Y(n57), .A(net7), .B(n51), .C(net8), .D(n52) );
    MD40C \q_reg[2] ( .NQ(net8), .Q(q[2]), .CK(clk), .D(n58) );
    MC43E U22 ( .Y(n60), .B(net10), .NA(n51) );
    MC6E U23 ( .Y(n53), .A(net10), .B(net8), .C(net9), .D(net7) );
    MO2E U24 ( .Y(n51), .A(n53), .B(r) );
    MD40C \q_reg[3] ( .NQ(net7), .Q(q[3]), .CK(clk), .D(n57) );
    MO3E U25 ( .Y(n52), .A(net9), .B(net10), .C(n51) );
    MC44E U26 ( .Y(n54), .B(n51), .NA(net9) );
    MC43E U17 ( .Y(n55), .B(n54), .NA(n60) );
    MC21E U18 ( .NY(n58), .A(n55), .B(n52), .S(net8) );
    MR2E U19 ( .Y(n56), .A(net10), .B(n51) );
endmodule
```

Fig. 24

```
module circuit (out, in, clk);

    input  in, clk;
    output out;

    reg  r1, r2, r3, r4;          // REGISTER
    wire r1x, r2x, r3x, r4x;          DEFINITION

                                    COMBINATIONAL
    function funcl;               // LOGIC        func1
     ...                            CIRCUIT
    endfunction

                                    COMBINATIONAL
    function func2;               // LOGIC        func2
     ...                            CIRCUIT
    endfunction

                                    COMBINATIONAL
    function func3;               // LOGIC        func3
     ...                            CIRCUIT
    endfunction

                                    COMBINATIONAL
    function func4;               // LOGIC        func4
     ...                            CIRCUIT
    endfunction

    assign r1x = func1(...)
    assign r2x = func2(...)
    assign r3x = func3(...)
    assign r4x = func4(...)

    always  (posedge clk)         //REGISTER  TRANSFER
        begin
        r1 = r1x;
        r2 = r2x;
        r3 = r3x;
        r4 = r4x;
    end

endmodule
```

LOGIC SYNTHESIS METHOD AND SEMICONDUCTOR INTEGRATED CIRCUIT

Matter enclosed in heavy brackets [ ] appears in the original patent but forms no part of this reissue specification; matter printed in italics indicates the additions made by reissue.

*RELATED REISSUE APPLICATIONS*

*This reissue application is a divisional of reissue application Ser. No. 09/076,703, filed on May 13, 1998, now U.S. Pat. No. RE37475, which was a reissue application of Ser. No. 08/375,413, filed on Jan. 18, 1995, which issued as U.S. Pat. No. 5,517,132.*

BACKGROUND OF THE INVENTION

This invention relates to a logic synthesis method for generating a semiconductor integrated circuit from data of register transfer level. This invention particularly pertains to a logic synthesis method for generating a low-power semiconductor integrated circuit and to a low-power semiconductor integrated circuit.

In recent years, a procedure known as a top-down design method has been used to lay out semiconductor integrated circuits. In the top-down design method, a targeted semiconductor integrated circuit is represented using functional descriptions of register transfer level (RTL). The processing of logic synthesis with the aid of RTL functional descriptions is carried out to generate targeted semiconductor integrated circuits.

FIG. 24 shows a usual RTL functional description. FIG. 25 shows a logic circuit, i.e., a semiconductor integrated circuit, which is generated by means of a logic synthesis technique using the FIG. 24 RTL functional description.

The FIG. 24 RTL functional description is one which specifies, at functional level, data transfer between registers. r1, r2, r3, and r4 represent respective registers, func1, func2, func3, and func4 are functional descriptions of combinational logic circuits connected between the registers. "assign" and "always" are sentences describing the connections of the registers with the combinational logic circuits.

When synthesizing a logic with the use of the FIG. 24 RTL functional description, it is determined on an area/rate tradeoff curve by giving area or rate constraint requirements.

In a logic of FIG. 25 generated from the FIG. 24 RTL functional description, 101, 103, 105, and 107 are flip-flops as a result of the mapping of the registers r1, r2, r3, and r4 by means of logic synthesis. The flip-flops 101, 103, 105, and 107 directly correspond to the respective registers r1, r2, r3, and r4. 108 is a clock buffer. 100, 102, 104, and 106 are combinational logic circuits respectively corresponding to func1, func2, func3, and func4 of FIG. 24 RTL functional description. The combinational logic circuits 100, 102, 104, and 106 are circuits that are mapped from the FIG. 24 RTL functional description as a single circuit on an area/rate tradeoff curve.

The power consumption P of the semiconductor integrated circuit can be found by:

$$P=f\times C\times V^2$$

where f is the operating frequency, C the load capacitance, and V the supply voltage. There are three ways of reducing the power consumption of the semiconductor integrated circuit. The first way is to reduce the operating frequency f.

The second way is to reduce the load capacitance C. The third way is to reduce the supply voltage V. Of these three ways the third one is considered as the most effective way.

The third way, however, produces the problem that if the supply voltage is set low, this increases the delay time of a critical path that has the maximum delay time among a great many paths together forming a logic circuit.

With a view to providing a solution to the above-described problem, Japanese Patent Application, published under Pub. No. 5-299624, [shows a technique. In accordance with this technique,] *discloses that* logic gates, not required to operate at a high speed, are driven by a low-voltage source, whereas other logic gates, required to operate at a high speed, are driven by a high-voltage source. [In other words, this technique is trying to reduce the overall power consumption of the semiconductor integrated circuit by driving only logic gates constituting a critical path using high voltage, without increasing the delay time of critical path. This technique, however, suffers the following drawbacks.] *However, the foregoing Japanese Patent Application fails to disclose the use of two voltage sources comprising a high and low voltage source in conjunction with any given critical path.*

When downloading data from a low-voltage driven, slow-speed logic gate to a high-voltage-driven, high-speed logic gate, this requires the provision of a level converter between these two logic gates in order that the output of the former logic gate increases in voltage level. Such is shown in Japanese Patent Application, published under Pub. No. 5-67963. Each combinational logic circuit of FIG. 25 is made up of a great many logic gates (see FIGS. 26 and 27). Suppose a critical path is one represented by bold line in the figures. In order to drive such a critical path by a high-voltage source, a level converter must be arranged at points marked with symbol ○. In FIG. 26, eight level converters muse be placed. In FIG. 27, 12 level converters must be placed. Semiconductor integrated circuits of large-scale integration contain a great number of combinational logic circuits, therefore containing a great number of logic gates. Accordingly, in a semiconductor integrated circuit of large-scale integration, a great number of level converters must be arranged in a single combinational logic circuit with a critical path. Further, there are many combinational logic circuits containing a critical path. This means that the entire semiconductor integrated circuit will have to contain an enormous number of level converters. With respect to a limited number of combinational logic circuits, it is possible to locate where to arrange level converters. However, if the entire semiconductor integrated circuit of large-scale integration is concerned, to locate where to arrange level converters is considerably troublesome and is a time consuming job. Complicated design work is required.

SUMMARY OF THE INVENTION

Bearing in mind the above-mentioned problems with the prior art techniques, the present invention was made. It is therefore an object of the present invention to provide an improved [logic synthesis method] *design method for designing a semiconductor device which is* capable of facilitating the generation of low-power semiconductor integrated circuits without increasing the delay time of a critical path contained in each combinational logic circuit of a targeted semiconductor integrated circuit. It is another object of the present invention to provide a low-power semiconductor integrated circuit, without causing the delay time of the circuit path to increase.

*In other words, an object of the present invention is to reduce the overall power consumption of the semiconductor*

*integrated circuit by driving only logic gates constituting a critical path using high voltage, without increasing the de time of the critical path.*

The following points were considered so as to accomplish the above-described objects of the present invention. As shown in FIG. 25, a semiconductor integrated circuit comprises a great many registers and a great many combinational logic circuits arranged between the registers. If a level converter is arranged within the register, this eliminates the need for providing a level converter at every point requiring the provision of a level converter when driving a critical path by a high-voltage source. This cuts down the number of points where a level converter must be placed. If a register is provided with a level converter, then it becomes necessary to drive an entire combinational logic circuit to which the level converter applies data by a high-voltage source. However, the number of logic gates along a critical path is about 5% of the total number of logic gates in the entire semiconductor integrated circuit. Therefore, the ratio of the number of combinational logic circuits with a critical path versus the total number of combinational logic circuits contained in the entire semiconductor integrated circuit is negligible. Because of this, driving a combinational logic circuit with a critical path by a high-voltage source will not greatly increase the power consumption of the semiconductor integrated circuit.

The present invention provides a logic synthesis method for synthesizing, based on connection information of logic cells, a semiconductor integrated circuit of a plurality of registers and a plurality of combinational logic circuits connected between the registers. This logic synthesis method comprises:

a first step for mapping, when there exists among the plural combinational logic circuits a combinational logic circuit with a signal propagation delay time below a design delay upper limit, such a combinational logic circuit into a combinational logic circuit of a first type driven by a low-voltage source, and for mapping, when there exists among the plural combinational logic circuits a combinational logic circuit with a signal propagation delay time above the design delay upper limit, such a combinational logic circuit into a combinational logic circuit of a second type driven by a high-voltage source;

a second step for determining which of the combinational logic circuits of the first type outputs to a combinational logic circuit of the second type and for remapping a combinational logic circuit of the first type, determined to output to a combinational logic circuit of the second type, into the second-type: and a third step for determining which of the registers generates a signal to a combinational logic circuit of the second type, for mapping a register, determined to generate a signal to a combinational logic circuit of the second type, into a register driven by the high-voltage source, and for mapping a register, determined not to generate a signal to a combinational logic circuit of the second type, into a register driven by the low-voltage source.

The present invention provides a semiconductor integrated circuit having a plurality of registers and a plurality of combinational logic circuits connected between the registers. In this semiconductor integrated circuit:

part of the plural combinational logic circuits are formed by respective combinational logic circuit of a first type driven by a low voltage source and the remaining part of the plural combinational logic circuits are formed by respective combinational logic circuits of a second type driven by a high-voltage source; and of the plural registers a register that has a combinational logic circuit of the first type on its input side and a combinational logic circuit of the second type on its output side is a circuit that has a temporary data storage driven by the low-voltage source and a level converter which is driven by the high-voltage source and which converts a low-voltage-level output signal, received from the temporary data storage, into a high-voltage-level output.

The action of the present invention is as follows. A semiconductor integrated circuit is made up of many registers and many combinational logic circuits connected between the registers, and some of these combinational logic circuits have a critical path. A register arranged upstream of a combinational logic circuit with a critical path, i.e., a register that applies data to such a critical-path-contained combinational logic circuit, is provided with a level converted. The critical-path-contained combinational logic circuits are driven by a high-voltage source. The remaining other combinational logic circuits are driven by a low-voltage source.

Since every combinational logic circuit with a critical path is driven by the high-voltage source, the delay time of the critical path is held to below a design delay upper limit. Because of the provision of a level converter as described above, the number of level converters required can be reduced in comparison with a ease in which only critical paths are driven by the high-voltage source. This considerably facilitates the semiconductor integrated circuit design. Even when driving each combinational logic circuit with a critical path by a high-voltage source, the increase in power consumption is held low since the ratio of the number of combinational logic circuits with a critical path to the total number of combinational logic circuits with a critical path to the total number of combinational logic circuits is negligible. Meanwhile, the other combinational logic circuits without a critical path are driven by the low-voltage source, this greatly contributes to the reduction of the power consumption of the semiconductor integrated circuit.

BRIEF DESCRIPTION OF THE DRAWING FIGURES

The invention will be better understood from the following description when considering with the accompanying drawing figures.

FIG. 1 schematically shows the entire image processor

FIG. 2 schematically shows the entire semiconductor chip.

FIG. 10 shows a hardware description language.

FIG. 11 is a diagram showing a net list.

FIG. 24 shows a register transfer level description.

DETAILED DESCRIPTION OF THE INVENTION

Referring now to the accompanying drawing figures, a preferred embodiment of the present invention will be described below.

Figure 1:
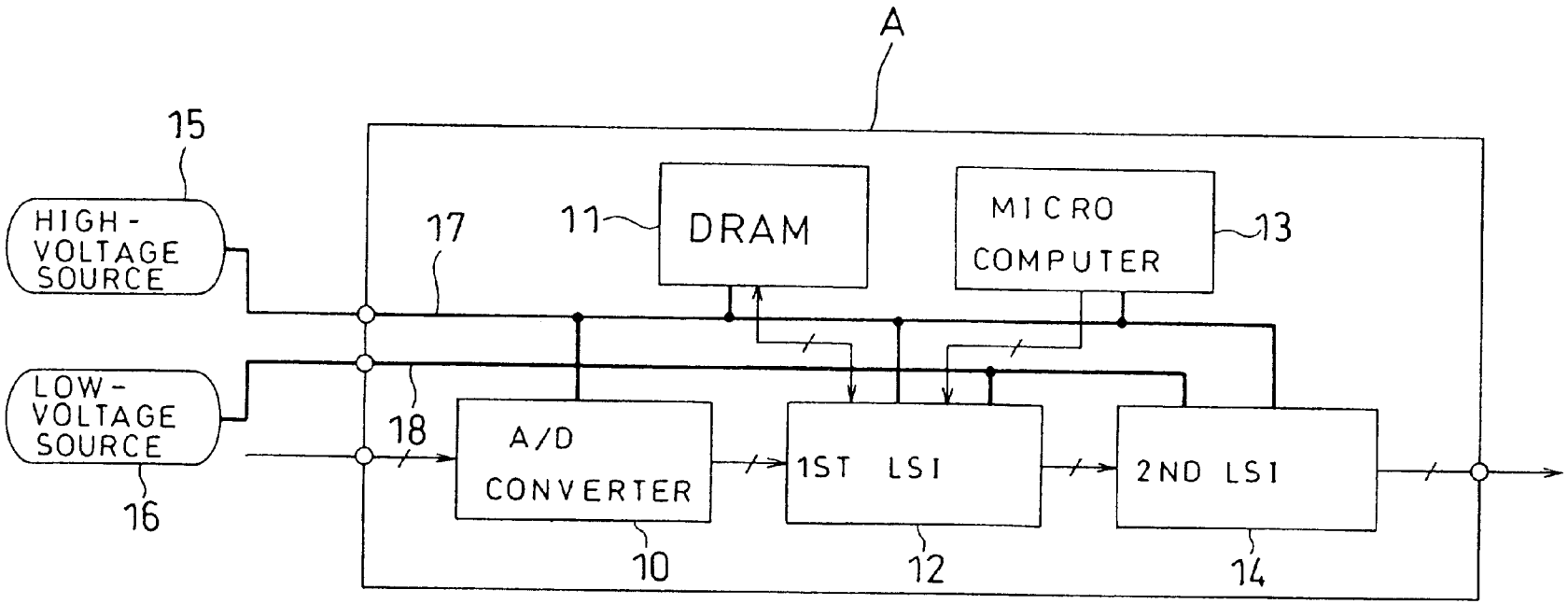

FIG. 1 schematically shows an image processor A employing a semiconductor integrated circuit based on the present invention. 10 is an analog-to-digital converter (ADC) for converting an external signal to a digital output. 11 is a general-purpose dynamic random access memory (DRAM). 12 is a first semiconductor integrated circuit (SIC) of the present invention for reading data from the DRAM 11 or writing data to the DRAM 11 while at the same time performing image processing. 13 is a general-purpose micro computer for controlling the first SIC 12. 14 is a second SIC for performing further image processing upon receipt of a signal from the first SIC 12.

15 is a high-voltage source, e.g., a 3 V source, which is arranged outside. 16 is a low-voltage source, e.g., a 2 V source, which is also arranged outside. The image processor A has a high-voltage line 17 associated with the high-voltage source 15 and a low-voltage line 18 associated with the low-voltage source 16. In order to reduce the power consumption of the image processor A, the low-voltage source 16 serves as a voltage source for the first and second SICs 12 and 14 for image processing, and low voltage is applied through the low-voltage line 18 only to the first and second SICs 12 and 14. On the other hand, high-voltage is applied through the high-voltage line 17 to the ADC 10, to the DRAM 11, and to the micro computer 13. Since there is the need for increasing the interface voltages among the circuits 10–14, high voltage is also applied to the first and second SICs 12 and 14 via the high-voltage line 17.

The low-voltage source 16 may be an internal low-voltage source as a result of lowering the voltage of the high-voltage line 17 by its threshold voltage by means of an internal transistor. The structure of such an internal low-voltage source is shown in Japanese Patent Application, published under Pub. No. 4-96369, which eliminates the need for the provision of the low-voltage source 16.

Figure 2:
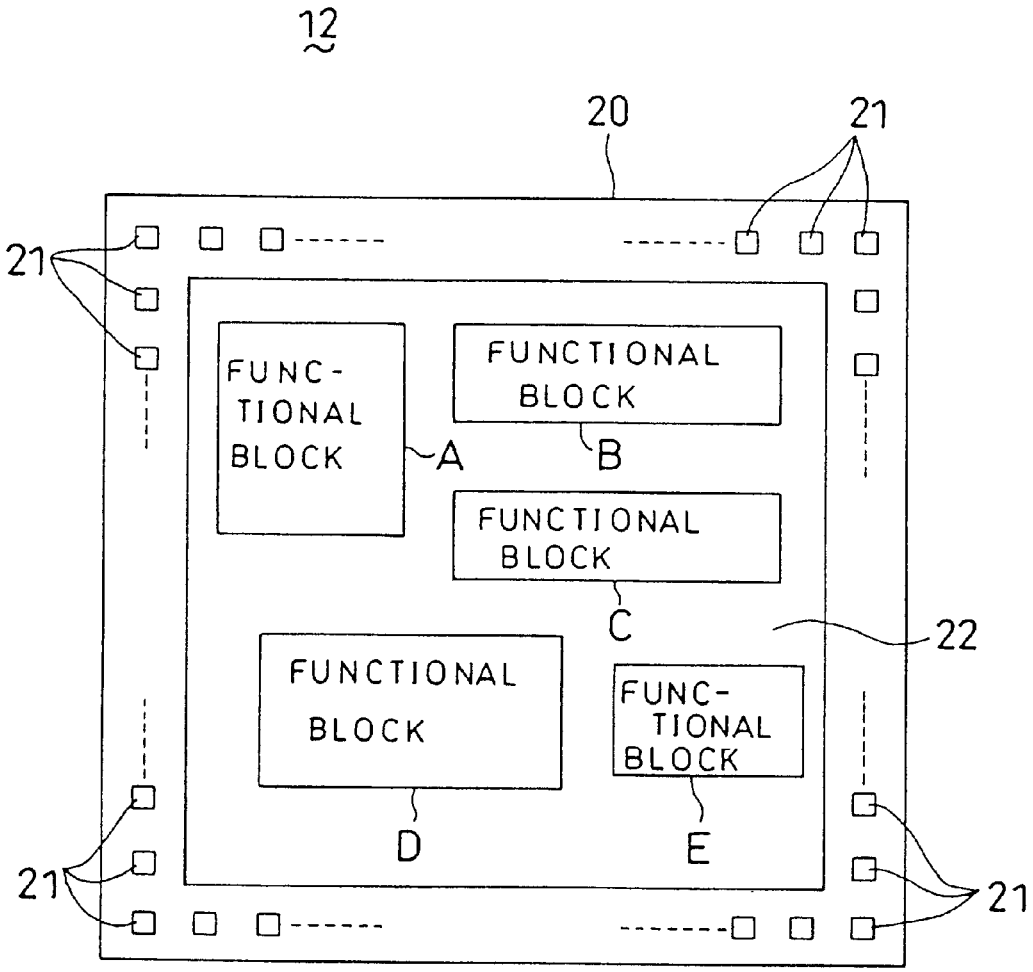

FIG. 2 depicts the internal structure of the first SIC 12 for image processing. 20 is a chip. 21, 21, . . . are input/output pads provided on the periphery of the chip 20. 22 is an internal core that is an area exclusive of the area for the input/output pads 21. Provided within the internal core 22 are five functional blocks A, B, C, D, and E. The functional blocks A, B, C, D, and E are arithmetic processing circuits for performing their respective arithmetic operations. The functional block E is a memory cell section with a small storage capability, e.g., ROM and RAM.

The present invention is applied to functional blocks other than the functional block E, i.e., the functional blocks A, B, C, and D of the first SIC 12.

Figure 3:
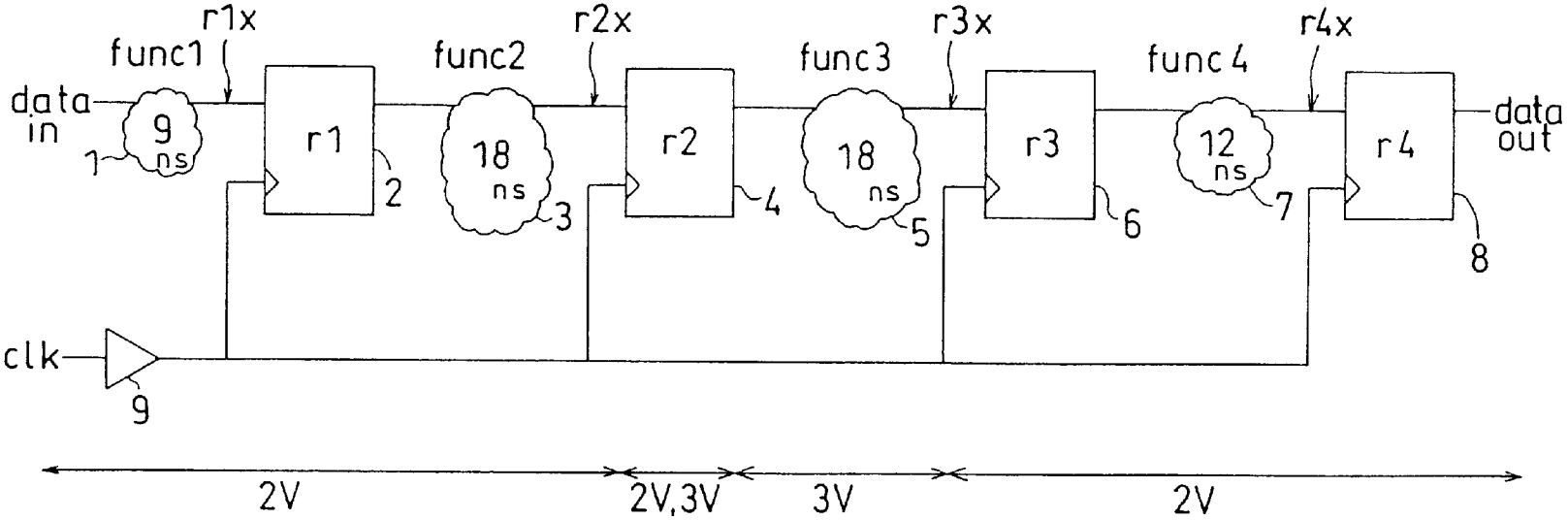
FIG. 3 shows the connections of plural registers with plural combinational logic circuits in a semiconductor integrated circuit according to the present invention.

FIG. 3 shows a logic circuit diagram of an arbitrary functional block of the first SIC 12 (e.g., the functional block A).

The functional block (i.e., a part of the SIC 12) as shown in FIG. 3 is a logic circuit as a result of the logic synthesizing of the FIG. 24 RTL functional description. 2, 4, 6, and 8 are flip-flops respectively forming registers r1, r2, r3, and r4 of the FIG. 24 RTL functional description. 1, 3, 5, and 7 are combinational logic circuits respectively forming func1, func2, func3, and func4 and are arranged in such a way as shown in FIG. 3. In FIG. 3, the output of each combinational logic circuit is applied only to the next flip-flop. However, the output of a combinational logic circuit may be applied to another combinational logic circuit.

The flip-flops 2, 6, and 8 are 2 V flip-flops driven by the low-voltage source 16. The remaining flip-flop, i.e., the flip-flop 4, is a 2V/3 V flip-flop driven by both the low-voltage source 16 and the high-voltage source 15. The flip-flop 4 contains therein a level converter which will be described later. On the other hand, the flip-flops 2, 6, and 8 do not contain a level converter. The combinational logic circuits 1, 3, and 7 are 2 V combinational logic circuits driven by the low-voltage source 16 (i.e., the first-type combinational logic circuit). The combinational logic circuit 5, since it is required to operate at a high speed, is a 3 V combinational logic circuit driven by the high-voltage source 15 (i.e., the second-type combinational logic circuit).

9 is a 2 V clock buffer driven by the low-voltage source 16. This clock buffer 9 feeds a clock to each flip-flop 2, 4, 6, and 8.

Figure 4:
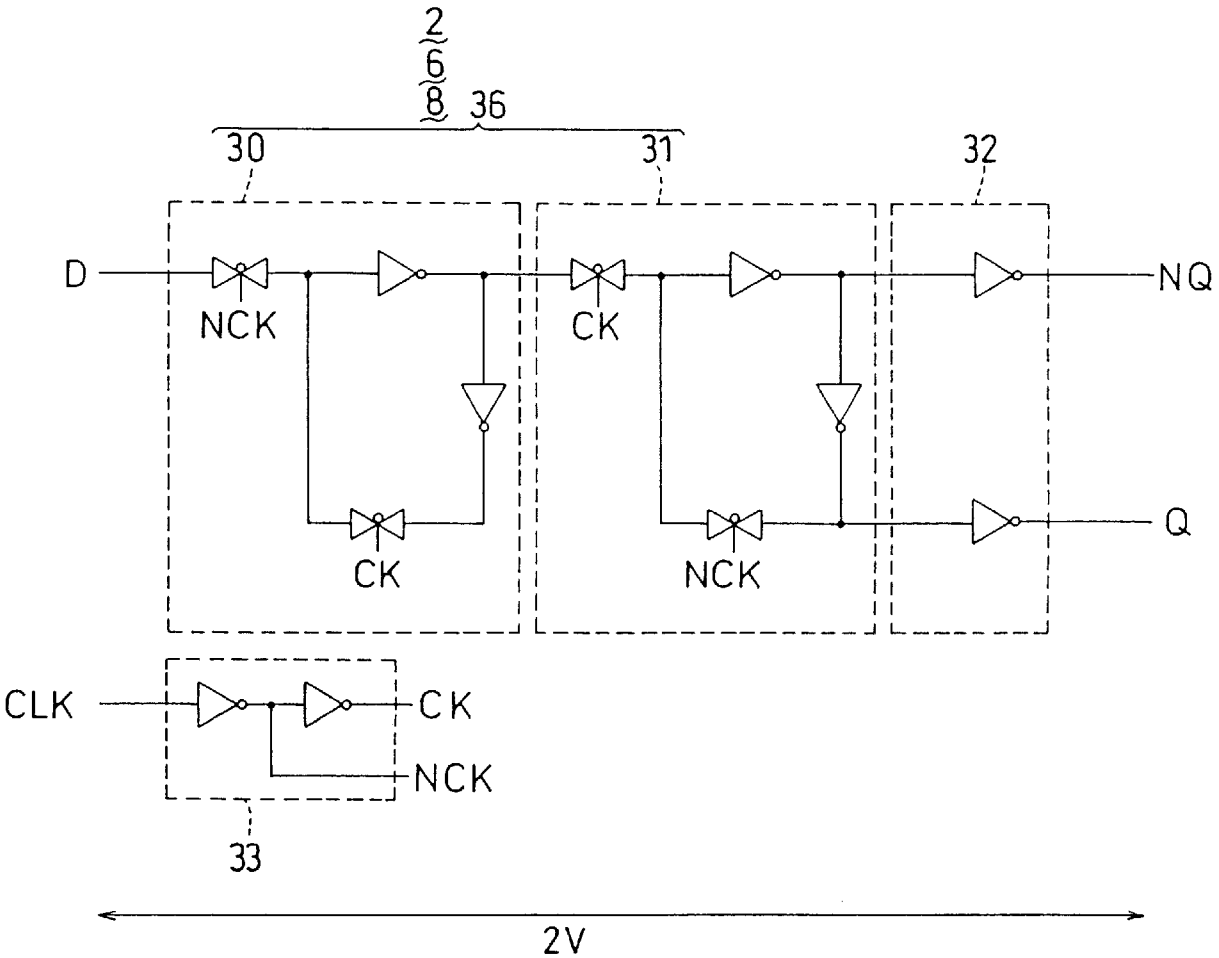
FIG. 4 shows a flip-flop without a level converter.

FIG. 4 shows the structure of the flip-flops 2, 6, and 8 without the aforesaid 2 V level converter 30 is a master latch that receives an external signal D. 31 is a slave latch that is connected in series with the output side of the master latch 30 and outputs a pair of signals of opposite type, i.e., complementary signals. The master latch 30 and the slave latch 31, connected in series, together constitute a temporary memory 36. 32 is an output buffer that is coupled to the output side of the slave latch 31. 33 is an internal clock generator for generating complementary internal clocks CK and NCK from an incoming CLK. These circuits 30–33 are 2 V circuits driven by the low-voltage source 16.

Figure 5:
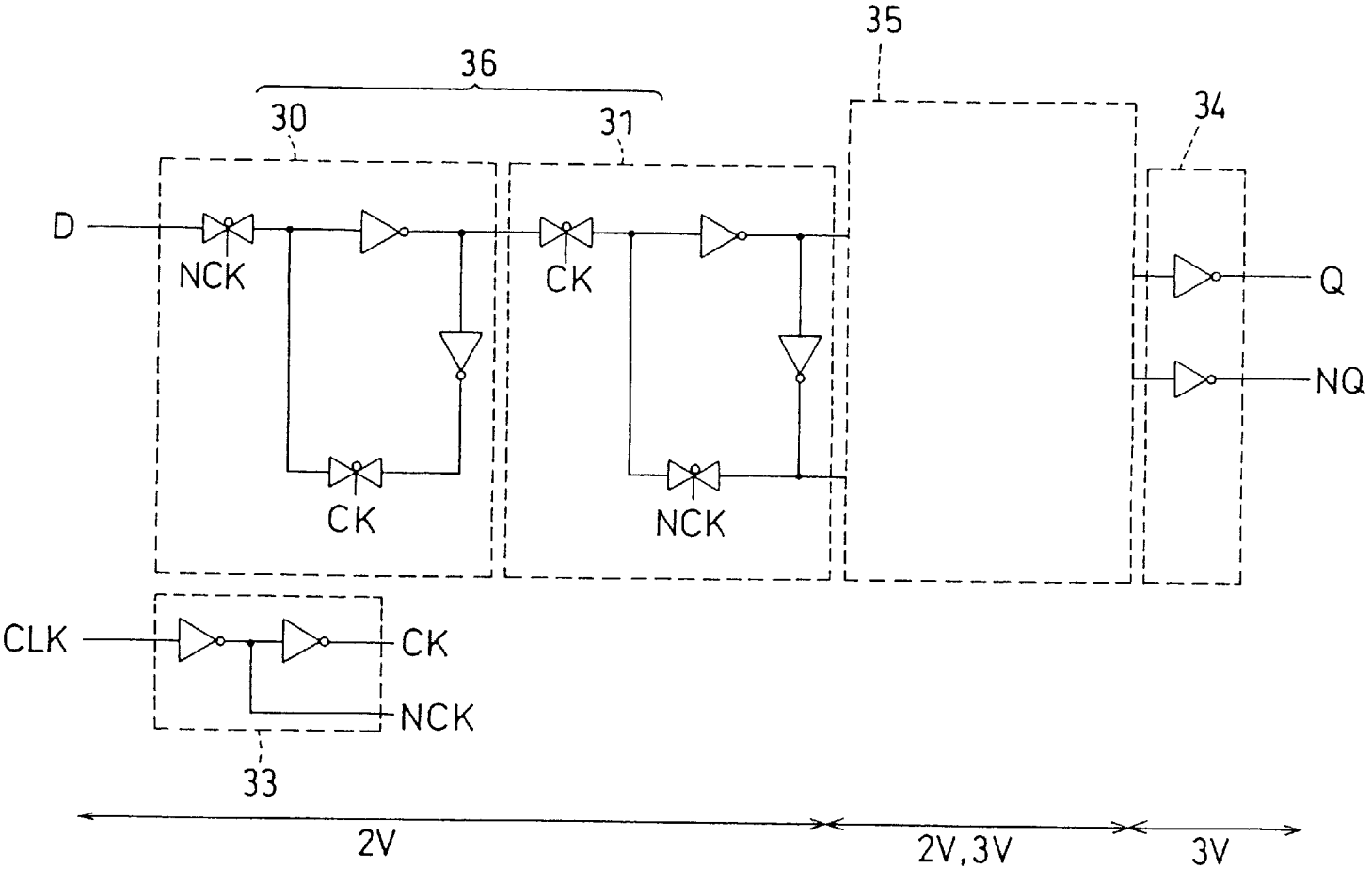
FIG. 5 shows a flip-flop with a level converter.

FIG. 5 shows the structure of the flip-flop 4 containing the aforesaid 2 V/3 V level converter. The flip-flop 4 of FIG. 5, like the flip-flop 2 of FIG. 4, has the master latch 30 and the slave latch 31 which are connected together in series and the internal clock generator 33. The flip-flop 4 further includes an output buffer 34 that is driven by the high-voltage source 15 and a level converter 35 connected between the slave latch 31 and the output buffer 34. This level converter 35, which is a 2 V/3 V circuit, receives from the slave latch 31 a pair of signals of opposite type. There is a 2 V difference between the received pair of complementary signals. The level converter 35 then performs a level conversion on the received complementary signals in such a way as to provide another pair of complementary signals with a 3 V difference between them.

Figure 6A:
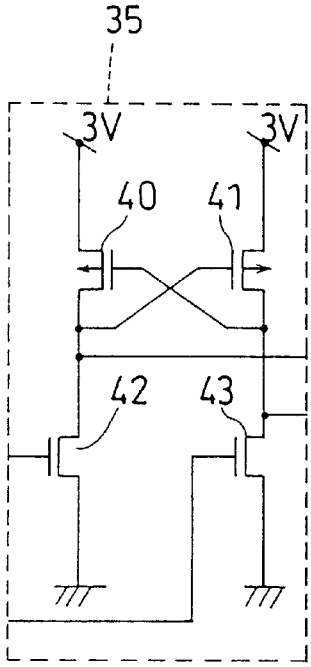
FIG. 6a shows a level converter.

The level converter 35 will be described in detail by making reference to FIGS. 6a and 6b. Whereas 40 and 41 are PMOS transistors, 42 and 43 are NMOS transistors. The PMOS transistor 40 is connected in series with the NMOS transistor 42 to form an in-series circuit. The PMOS transistor 41 is connected in series with the NMOS transistor 43 to form another in-series circuit. Both the in-series circuits are arranged between the high-voltage source 15 and the ground. The gate of the PMOS transistor 40 is connected to the drain of the NMOS transistor 43. The gate of the PMOS transistor 41 is connected to the drain of the NMOS transistor 42. Complementary outputs are extracted from the drains of the NMOS transistors 42, 43. As a result of the above-described arrangement, the PMOS transistor 40 and the NMOS transistor 42 jointly function as an inverter, and the PMOS transistor 41 and the NMOS transistor 43 jointly function as an inverter. Due to the complementary outputs of the slave latch 31 of FIG. 5, the gate of the NMOS transistor 48 is fed a low voltage of 2 V and the gate of the NMOS transistor 42 is fed a voltage of 0 V. The NMOS transistor 43 turns on, and the NMOS transistor 42 turns off. Then, the PMOS transistor 40 turns on, and the PMOS transistor 41 turns off. This results in establishing a connection between the drain of the NMOS transistor 42 and the high-voltage source 15, and the drain of the NMOS transistor 43 is connected to ground, whereupon complementary outputs are produced, with a 3 V difference between them. The structure of FIG. 6a can perform the above-described low-to-high level conversion on the complementary outputs of the slave latch 31 of FIG. 5, generating neither a current flow passing through from the high-voltage source 15 to the low-voltage source 16 nor a current flow passing through from the high-voltage source 15 to ground (i.e., 0 V).

Figure 6B:
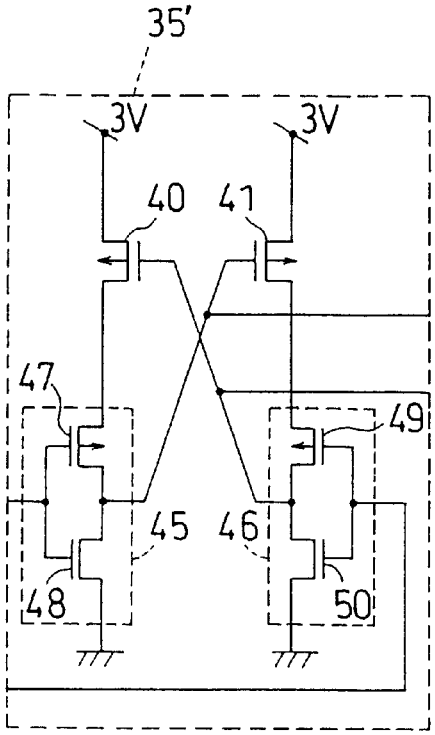
FIG. 6b shows another level converter.

FIG. 6b shows another level converter 35'. This level converter 35' does not use the NMOS transistors 42 and 43 of the level converter 35 (see FIG. 6a) but employs CMOS inverters 45 and 46 instead. The CMOS inverter 45 is formed by a PMOS transistor 47 and an NMOS transistor 48, the PMOS transistor 47 and the NMOS transistor 48 being connected in series. The CMOS inverter 46 is formed by a PMOS transistor 49 and an NMOS transistor 50, the PMOS transistor 49 and the NMOS transistor 50 being connected in series. On the one hand, the gates of the PMOS transistor 47 and the NMOS transistor 48 (i.e., the input terminal of the CMOS inverter 45) are fed one of the complementary outputs of the slave latch 31 of FIG. 5. On the other hand, the gates of the PMOS transistor 49 and the NMOS transistor 50 (i.e., the input terminal of the CMOS inverter 46) are fed the other of the complementary outputs of the slave latch 31. The output terminal of the CMOS inverter 45 (i.e., a connection point where the PMOS transistor 47 and the NMOS transistor 48 are connected together) is connected to the gate of a PMOS transistor not connected in series with the CMOS inverter 45, that is, the PMOS transistor 41. The output terminal of the CMOS inverter 46 is connected to the gate of the PMOS transistor 40 not connected in series with the CMOS inverter 46. The outputs of the CMOS inverters 45 and 46 are the complementary outputs of the level converter 35'. As a result of such arrangement, the complementary outputs of the slave latch 31 of FIG. 5 with a 2 V difference between them can be level-converted into another pair of complementary outputs with a 3 V deference between them, generating neither a current flow passing through from the high-voltage source 15 to the low-voltage source 16 nor a current flow passing through from the high-voltage source 15 to ground (i.e., 0 V). Additionally, the PMOS transistors forming the CMOS inverters 45 and 46 work to control the flow of current passing through from the high-voltage source 15 to ground, in a transient state.

As described above, the flip-flop 2 has on its input and output sides the 2 V combinational logic circuits 1 and 3. In other words, the flip-flop 2 is formed by low-voltage (i.e., 2 V) circuits. On the other hand, the flip-flop 4 has the 2 V combinational logic circuit 3 on its input side and the 3 V combinational logic circuit 5 on its output side. In other words, the flip-flop 4 is formed by a low-voltage (i.e., 2 V) circuit and a high-voltage (3 V) circuit. The flip-flop 6 has the 3 V combinational logic circuit 5 on its input side and the 2 V combinational logic circuit 7 on its output side. In other words, the flip-flop 6 is formed by low-voltage circuits.

Figure 7:
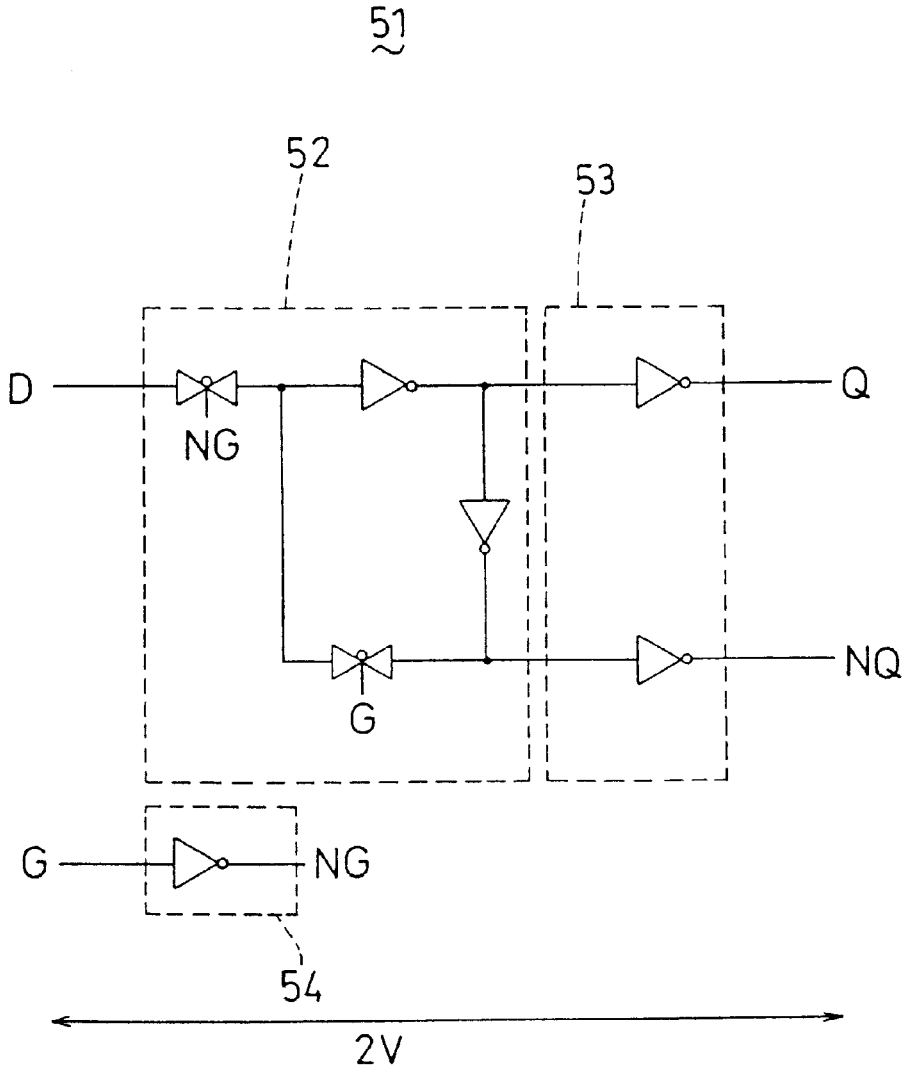
FIG. 7 shows a latch circuit without a level converter.
Figure 8:
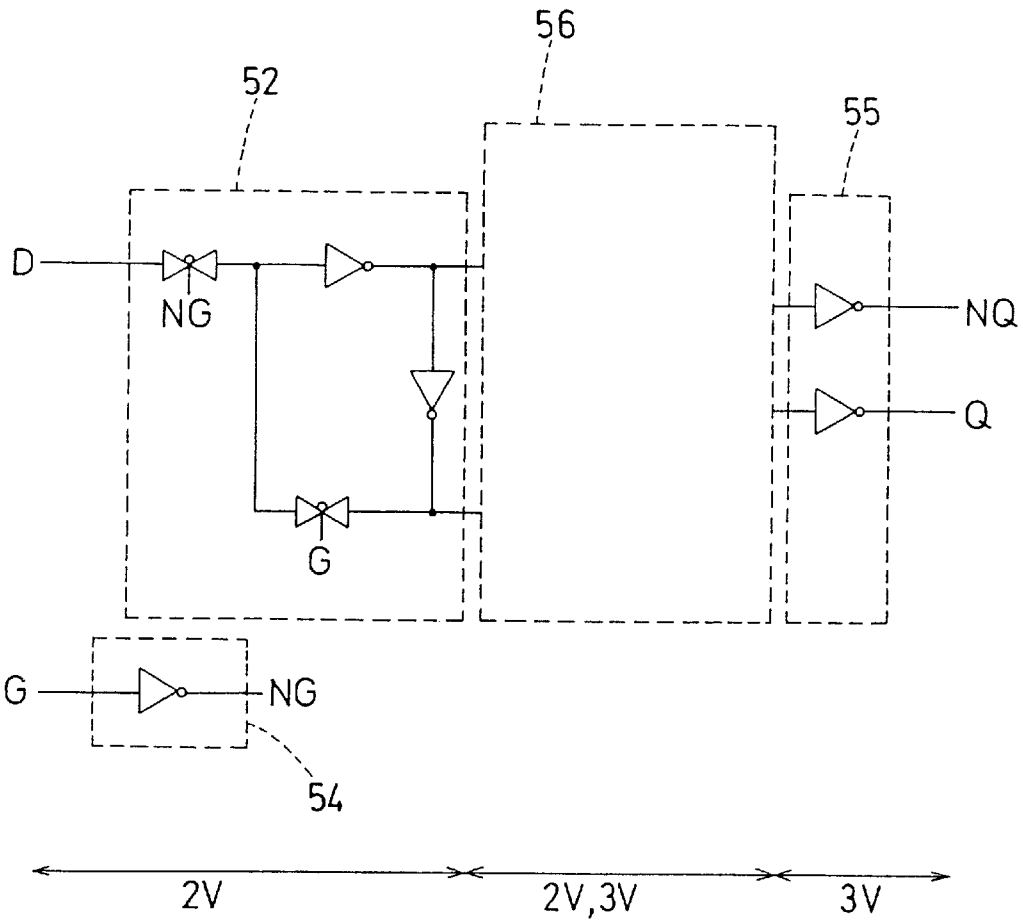
FIG. 8 shows a latch circuit with a level converter.

In the description above, each register r1, r2, r3, r4 is formed by a flip-flop, but they may be formed by a latch. Such a latch is illustrated in FIGS. 7 and 8. FIG. 7 shows a 2 V latch 51. The latch 51 has a latch section 52 (i.e., a temporary storage), an output buffer 53, and an internal clock generator 54. The latch section 52 inputs a signal D and latches same to generate complementary outputs. The output buffer 53 is connected to the output side of the latch section 52. The internal clock generators 54 generates an internal clock NG from an external clock G and provides the generated internal clock NG to the latch section 52. The external clock G is also applied to the latch section 52. These circuits 52–54 are 2 V circuits driven by the low-voltage source 16. FIG. 8 shows a 2 V/3 V latch 51'. The latch 51' has the latch section 52 and the internal clock generator 54 both receiving drive power from the low-voltage source 16, an output buffer 55 receiving drive power from the high-voltage source 15, and a level converter 56 which is connected between the latch section 52 and the output buffer 55 and which receives a pair of complementary signals with a 2 V difference between them thereby performing a level conversion to provide another pair of complementary signals with a 3 V difference between them. This level converter 56 is identical in configuration with the one as shown in FIG. 6a or 6b.

Figure 9:
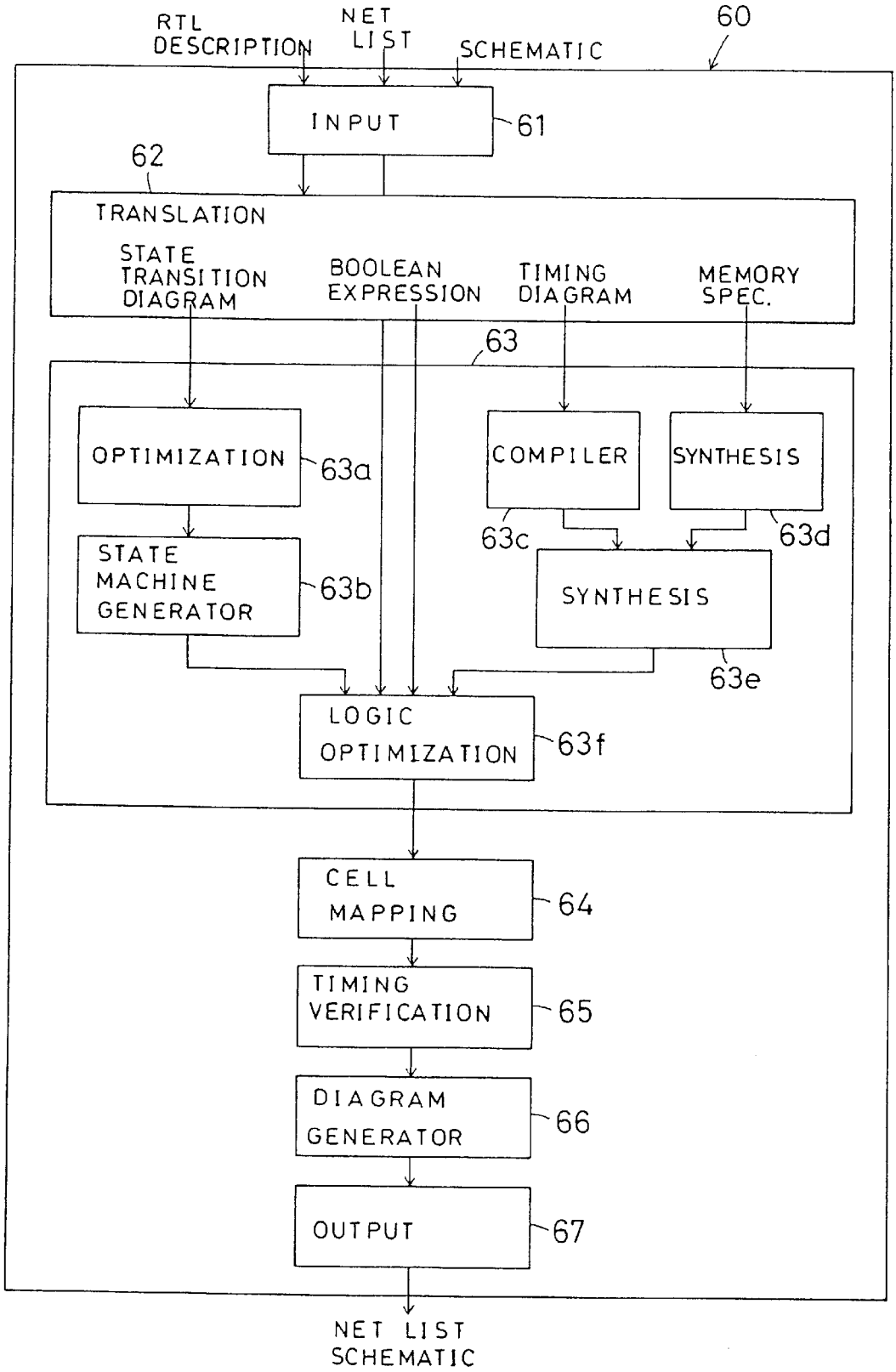
FIG. 9 shows the entire logic synthesis system.
Figure 13:
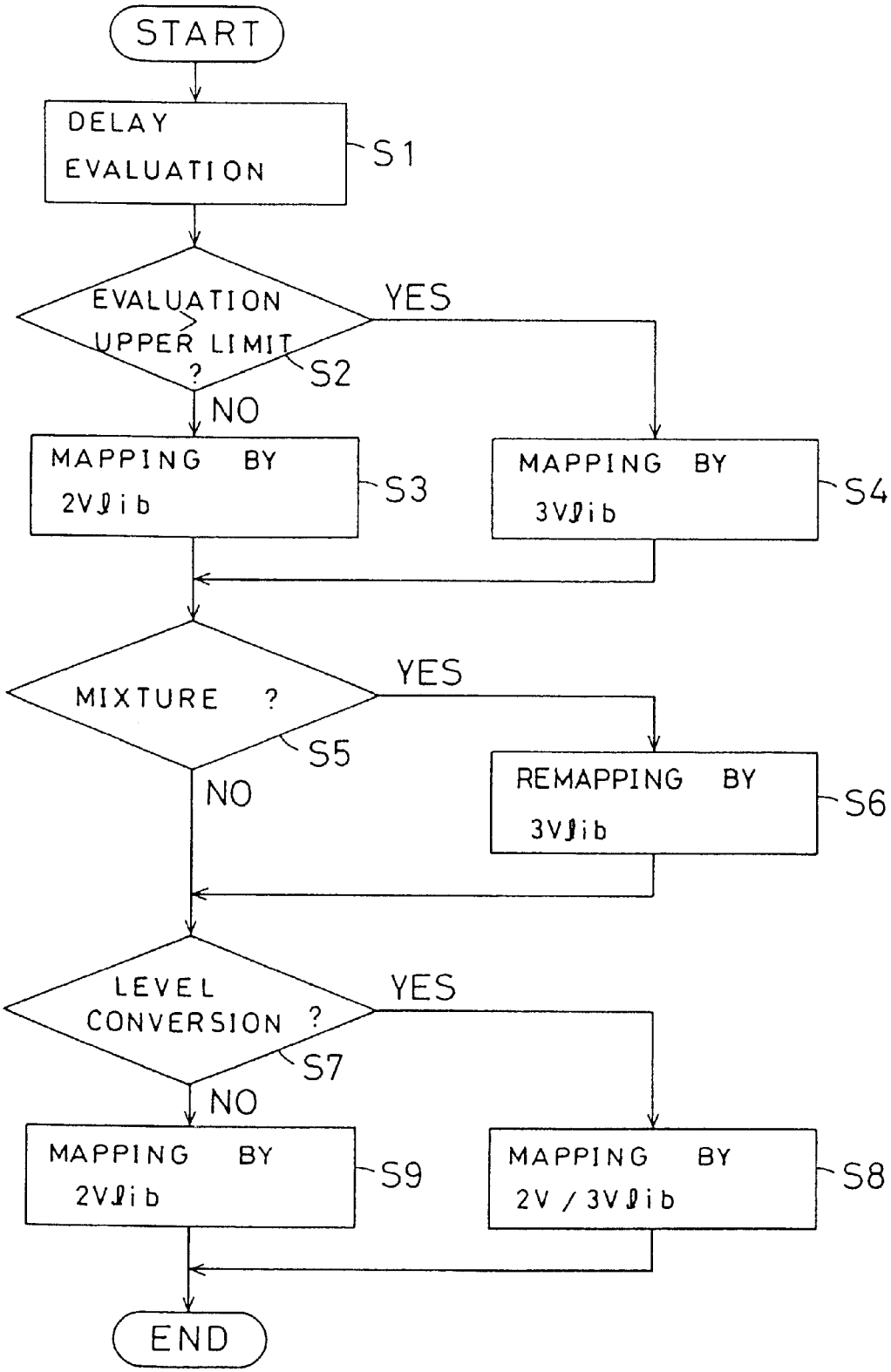
FIG. 13 is a diagram illustrating a logic synthesis method of the semiconductor integrated circuit.
Figure 14:
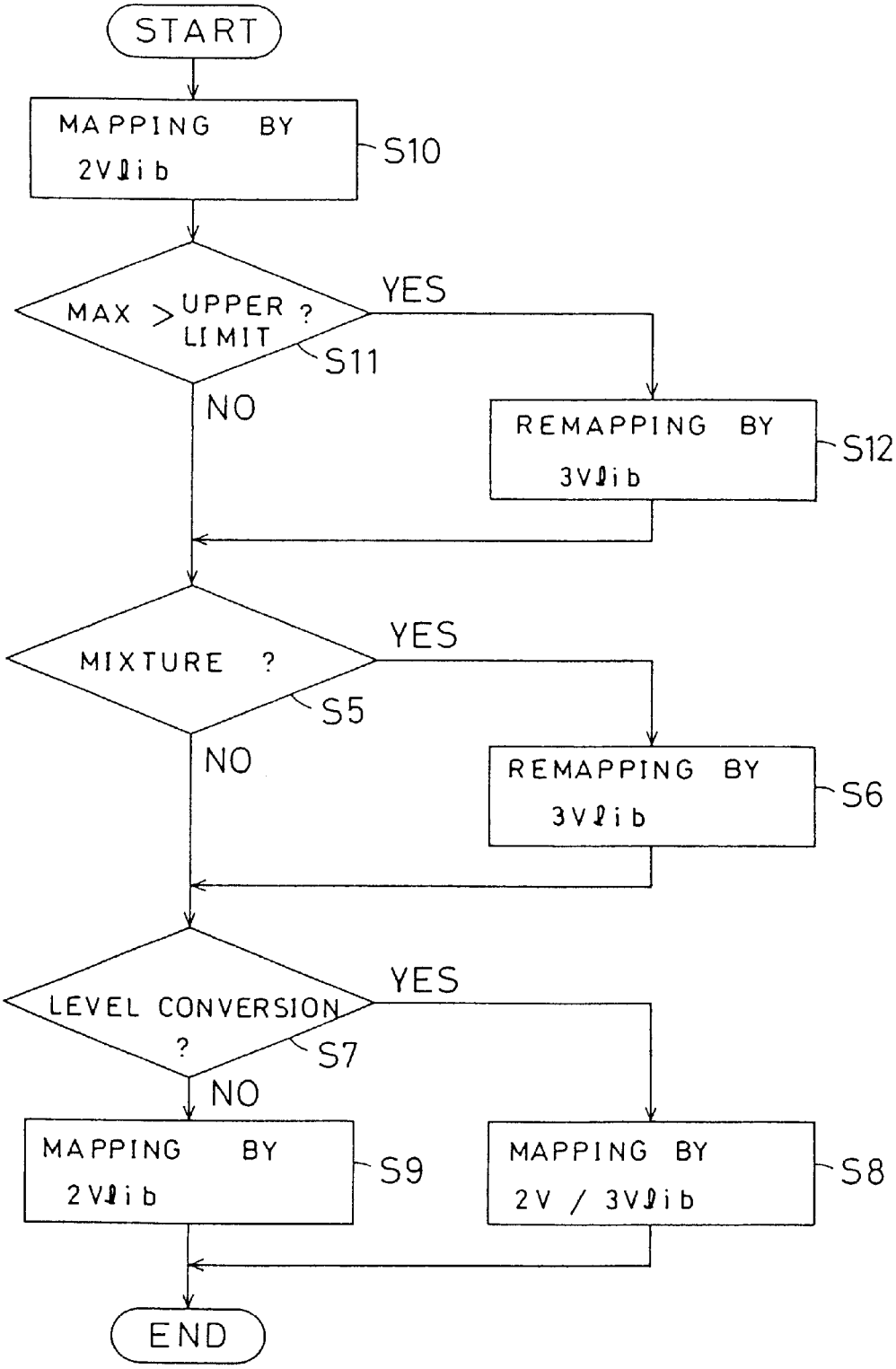
FIG. 14 is a diagram illustrating another logic synthesis method of the semiconductor integrated circuit.

Referring now to FIGS. 9, 13, and 14, a logic synthesis algorithm for generating, based on logic-cell connection information, a semiconductor integrated circuit as shown in the FIG. 3 will be described below.

Figure 12:
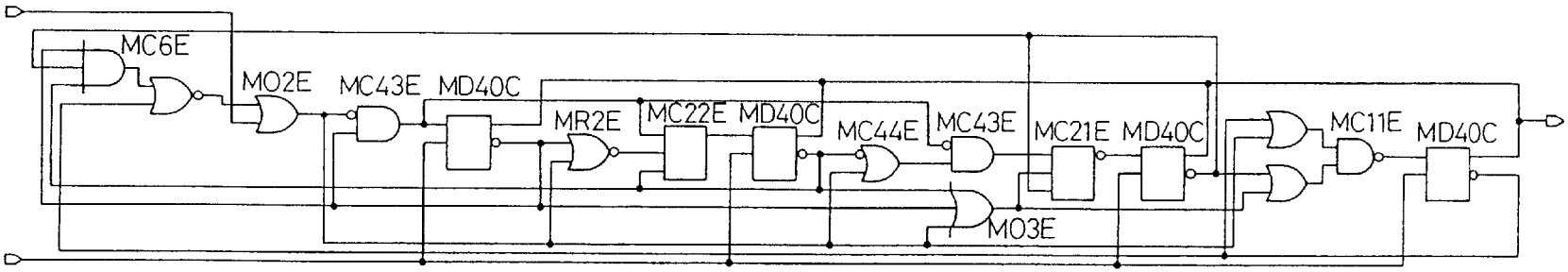
FIG. 12 is a diagram showing a schematic.

FIG. 9 shows the entire logic synthesis system 60. 61 is an input section. 62 is a translation section. 63 is an optimization section. 64 is a cell mapping section. 65 is a timing verifier. 66 is a circuit diagram generator. 67 is an output section. The input section 61 inputs either an RTL functional description (i.e., a hardware description language) such as shown in FIG. 10 or 24, a net list of FIG. 11 which species the register-to-register signal propagation relationship at logic cell connection information level on the basis of the RTL functional description, or a schematic of FIG. 12 as a result of schematizing the net list. The translation section 62 inputs an RTL functional description from the input section 61, thereby converting the received RTL functional description into state transition diagrams, Boolean expressions, timing diagrams, and memory specifications indicative of the type of memory, the number of bits, and the number of words and so on.

The optimization section 63 has the following components: a state-transition-diagram optimization processing section 63a for optimizing a state transition diagram obtained; a state machine generator 63b for generating a circuit, i.e., a state machine, corresponding to the optimized state transition diagram; a timing-diagram comelier 63c for compiling a timing diagram obtained; a memory synthesis section 63d for the synthesizing of a memory according to memory specifications obtained; and an interface-section synthesis section 63e for the synthesizing of an interface section according to the compiled timing diagram and the synthesized memory. If the input section 61 inputs an RTL functional description, then the optimization section 63 performs, based on the obtained state machine, the obtained Boolean expression, and the synthesized interface section, the optimization of a logic in order to generate optimized logic cell connection information. On the other hand, if the input section 61 inputs either a net list or a schematic, then the optimization section 63 performs the optimization of a logic for the net list or the schematic. The optimization section 63 further has a logic optimization section 63f for generating connection information of a logic optimized.

The output section 67 provides either a net list representing the FIG. 3 logic circuit or a logic circuit diagram (i.e., a schematic) as a result of schematizing the net list, to the outside.

The present invention pertains to the cell mapping section 64 as shown in FIG. 9. Cell mapping by means of the cell mapping section 64, i.e., an algorithm for the logic synthesizing of the FIG. 3 SIC according to cell connection information generated by the logic optimization section 63f, will now be described by reference to FIG. 13 Note that FIG. 13 mainly illustrates features of the present invention.

In a first procedure comprising steps S1 to S4, a combinational logic circuit, having a signal propagation delay time below a design delay upper limit, is mapped to a combinational logic circuit of a first type whose source of power is the low-voltage source 16. On the other hand, a combinational logic circuit, having a signal propagation delay time above the design delay upper limit, is mapped to a combinational logic circuit of a second type whose source of power is the high-voltage source 15.

The first procedure (S1–S4) proceeds as follows. In the first place, logic cell connection information is inputted from the logic optimization section 63f. Then, at step S1, by making use of signal propagation delay times of a 2 V flip-flop and a 2 V combinational logic circuit, a signal propagation delay time from the time a clock is inputted to an arbitrary flip-flop to the time data is inputted to the next-stage flip-flop is evaluated for every signal propagation path. Such an evaluation is made as follows. Information about logic circuits including AND, NOR, and NOT circuits (e.g., the type of logic, the number of inputs, and the number of logic stages) is extracted. Based on the extracted information as well as on the cell technology, a signal propagation delay time in mapping each logic into a cell is computed.

Step S2 determines whether or not the result of the evaluation is below the design delay upper limit. If found to be below the upper limit, then such a combinational logic circuit is mapped to a first-type combinational logic circuit stored in a low-voltage (2 V) logic cell library (hereinafter referred to as "lib") at step S3. On the other hand, if found to be above the upper limit, then the combinational logic circuit in question is mapped to a second-type combinational logic circuit stored in a high-voltage (3 V) logic cell library.

In a second procedure comprising steps S5 to S6, the following processing is executed. Step S5 determines whether or not there exists such an arrangement form that the output of a 2 V combinational logic circuit becomes the input of a 3 V combinational logic circuit. If step S5 says YES, then remapping is performed in order that the aforesaid 2 V combinational logic circuit (i.e., the first-type combinational logic circuit) is replaced with a 3Vlib's combinational logic circuit (the second-type combinational logic circuit), at step S6.

Since what voltage-type of combinational logic circuits to be arranged on the input and output sides of a register has already been decided by the aforesaid logic synthesis, a third procedure comprising steps S7 to S9 is performed as follows. Checking is made to determine whether or not each register performs a level conversion from low to high voltage (i.e., from 2 V to 3 V). If the result is YES, then at step S8 a register (a flip-flop or latch), found to perform a low-to-high level conversion, is mapped into the FIG. 5 2 V/3 V flip-flop or into the FIG. 8 2 V/3 V latch. If the result is NO, then at step S9 a register, found not to perform a low-to-high level conversion, is mapped into the FIG. 4 2 V flip-flop or into the FIG. 7 2 V latch.

FIG. 14 shows a revision of the FIG. 13 logic synthesis. In the FIG. 13 logic synthesis, the signal propagation delay time is evaluated in the first procedure, and, depending upon the result of the evaluation, mapping is carried out. The revisional logic synthesis of FIG. 14 proceeds as follows. First, at step S10, a combinational logic circuit is mapped to a 2Vlib's combinational logic circuit (i.e., the first-type combinational logic circuit). Then, at step 11, a check is made to determine whether or not the result of the mapping thus performed is below the design delay upper limit. If found to be above the delay upper limit, then remapping is performed in order that the aforesaid 2Vlib combinational logic circuit as a result of the step S10 mapping is replaced with a 3Vlib combinational logic circuit (i.e., the second-type combinational logic circuit), at step S12. The second and third procedures of the revisional logic synthesis and their counterparts of the FIG. 13 logic synthesis are the same, so that they are not described here.

Figure 15:
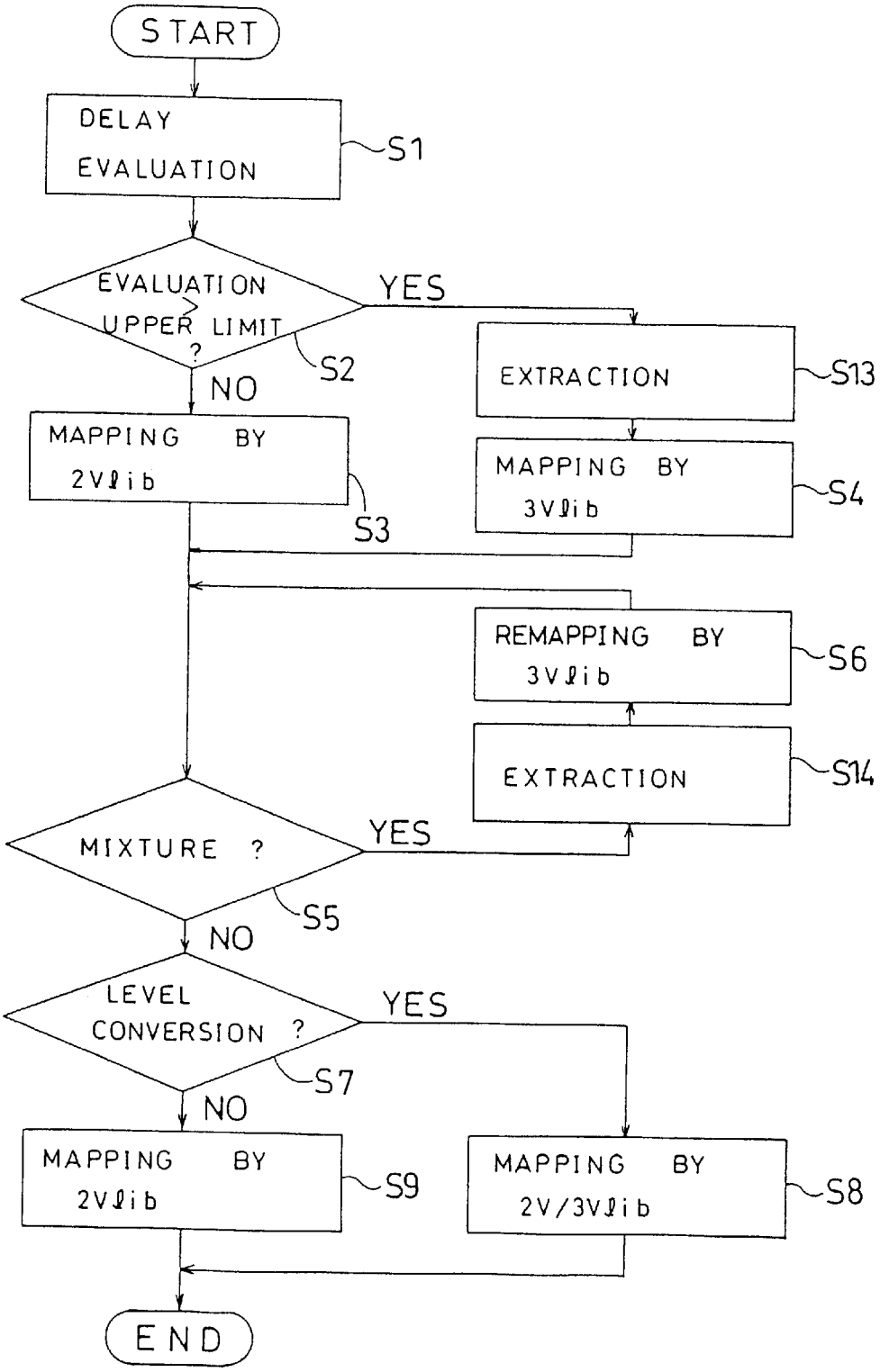
FIG. 15 is a revision of the FIG. 13 logic synthesis method.

FIG. 15 is another revision of the FIG. 13 logic synthesis method algorithm. This revision has an extra step in the first procedure, i.e., step S13. This step S13 is a step for previously extracting, when step S2 produces results of the signal propagation delay time evaluation in excess of the design delay upper limit, every combinational logic circuit of the first type (i.e., 2Vlib) that has a signal propagation delay time in excess of the design delay upper limit. This is followed by step S4 for mapping these extracted first-type combinational logic circuits into the second type. The second procedure also has an extra step, i.e., step S14. This step S14 is a step for previously extracting, when it is found that there exist combinational logic circuits of the first type which are mixed with combinational logic circuits of the second type, all of these combinational logic circuits of the first type. This is followed by step S6 for remapping these extracted combinational logic circuits of the first type into the second type. In addition, the second procedure has an extra algorithm so that the program returns to step S5 from step S6. The reason of why such an algorithm is provided is to cope with the problem that step S6 may result in producing a new mixed situation in which combinational logic circuits of the first type are mixed with combinational logic circuits of the second type. This problem is solved by the aforesaid algorithm by which the program will return to step S5.

Figure 16:
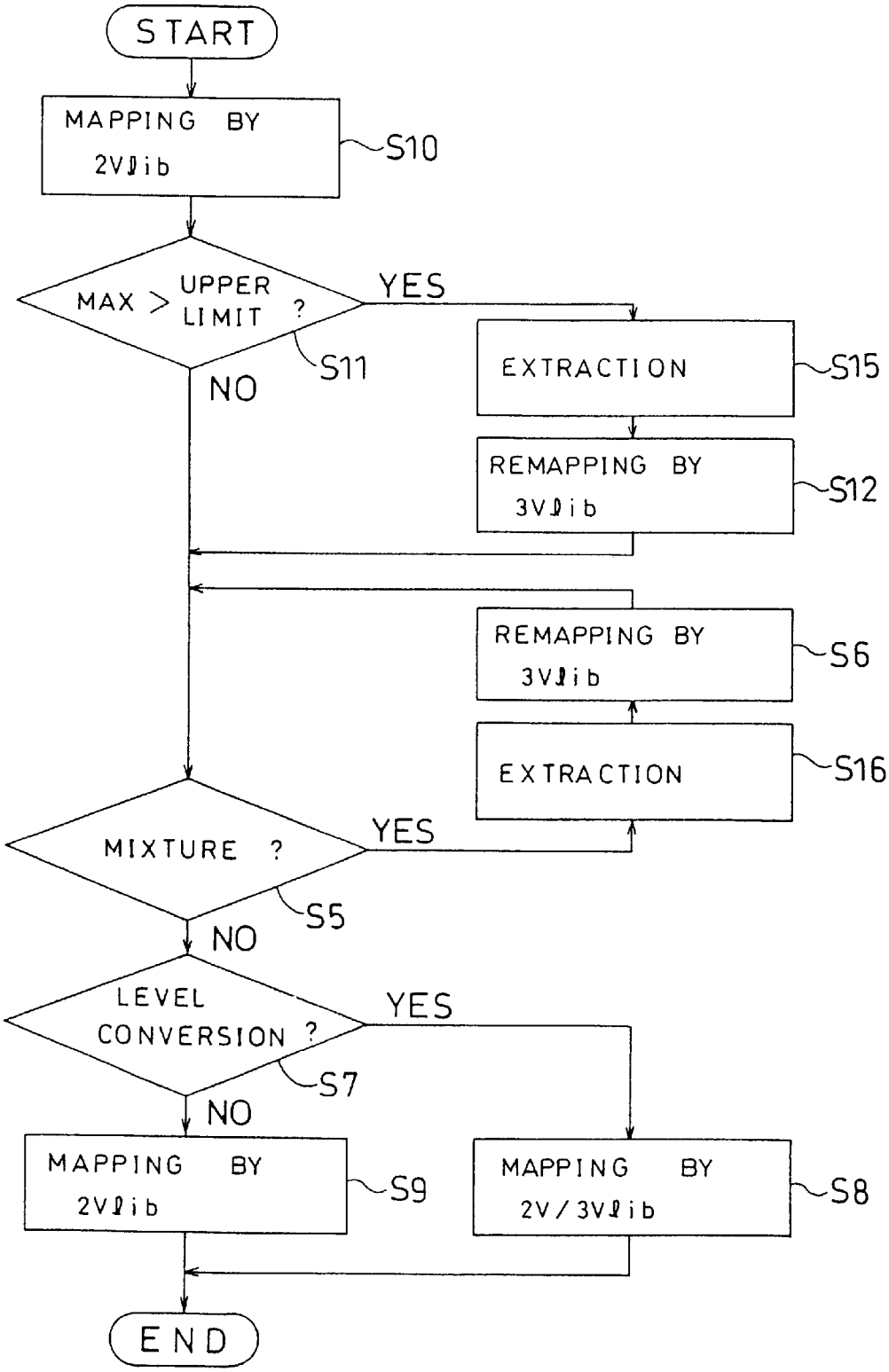
FIG. 16 is a revision of the FIG. 14 logic synthesis method.

FIG. 16 is still another revision of the FIG. 14 logic synthesis method algorithm. In this revision, the first procedure has an extra step, i.e., step S15. When it is found that there exists a combinational logic circuit or more of the first type with a signal propagation delay time above the design delay upper limit (step S11), every such a combinational logic circuit of the first type is previously extracted by step S15. The second procedure has an extra step, i.e., step S16. This step S16 is a step for previously extracting, when it is found that there exist combinational logic circuits of the first type which are mixed with combinational logic circuits of the second type (step S5), these combinational logic circuits of the first type. In addition, the second procedure has an extra algorithm so that the program returns to step S5 from step S6. The reason of why such an algorithm is provided is to cope with the problem that step S6 may result in producing a new mixed situation in which combinational logic circuits of the first type are mixed with combinational logic circuits of the second type. This problem is solved by the aforesaid algorithm by which the program will return to step S5.

Figure 17:
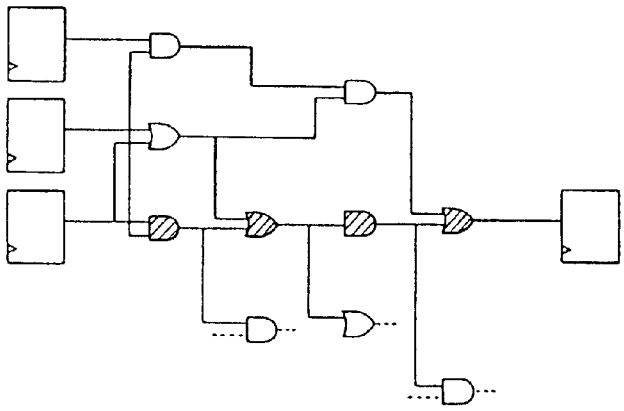
FIG. 17a is a diagram illustrating the mapping of a combinational logic circuit into a second-type combinational logic circuit at the first step.
FIG. 17b is a diagram illustrating the remapping of a first-type combinational logic circuit into a second-type combinational logic circuit at the second step.
FIG. 17c is a diagram illustrating the remapping of a first-type combinational logic circuit into a second-type combinational logic circuit due to the second step remapping to a second-type combinational logic circuit.
FIG. 17d is a diagram illustrating the mapping of a register into a flip-flop with a level converter.
Figure 17B:
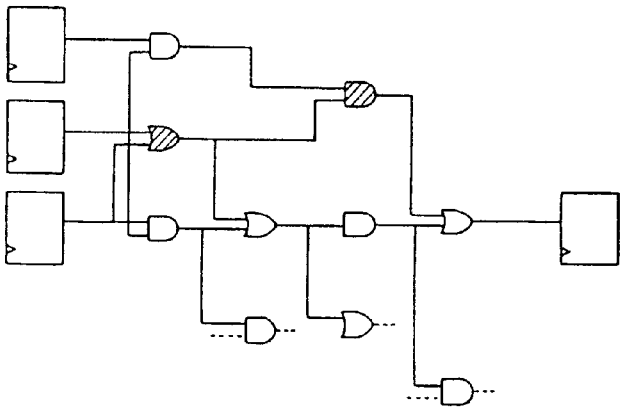
Figure 17C:
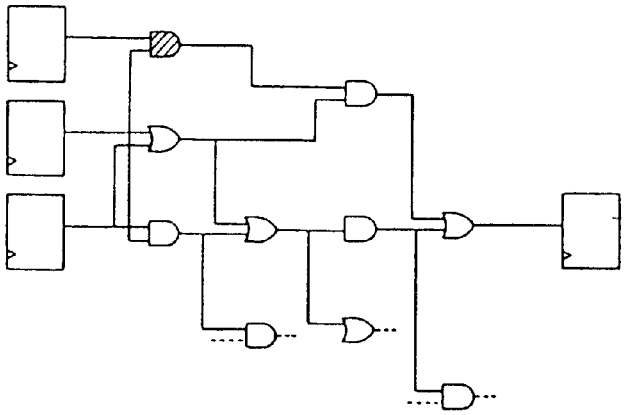
Figure 17D:
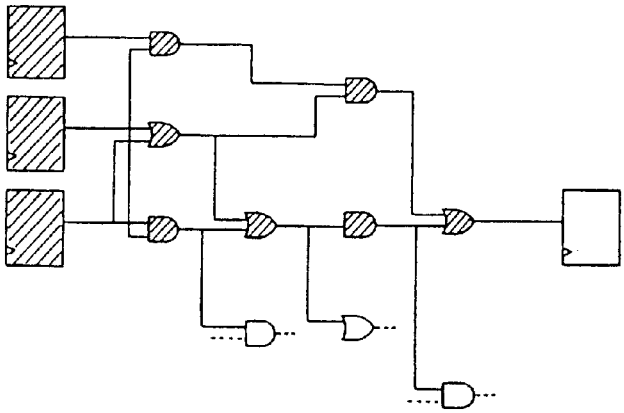

As described above, when some combinational logic circuits of the first type are found to have a signal propagation delay time above the design delay upper limit, these combinational logic circuits of the first type are mapped into combinational logic circuits of the second type of FIG. 17a which are hatched in the figure. If some combinational logic circuits of the first type are found to be mixed with combinational logic circuits of the second type, then these combinational logic circuits of the first type are remapped to combinational logic circuits of the second type of FIG. 17b which are hatched in the figure. If such remapping produces a new mixed situation, then another remapping process is carried out to eliminate such a situation. After this, when each flip-flop converts a low-voltage (2 V) input into a high-voltage (3 V) output, it is mapped into a respective 2 V/3 V flip-flop of FIG. 7d that is hatched in the figure.

Figure 18:
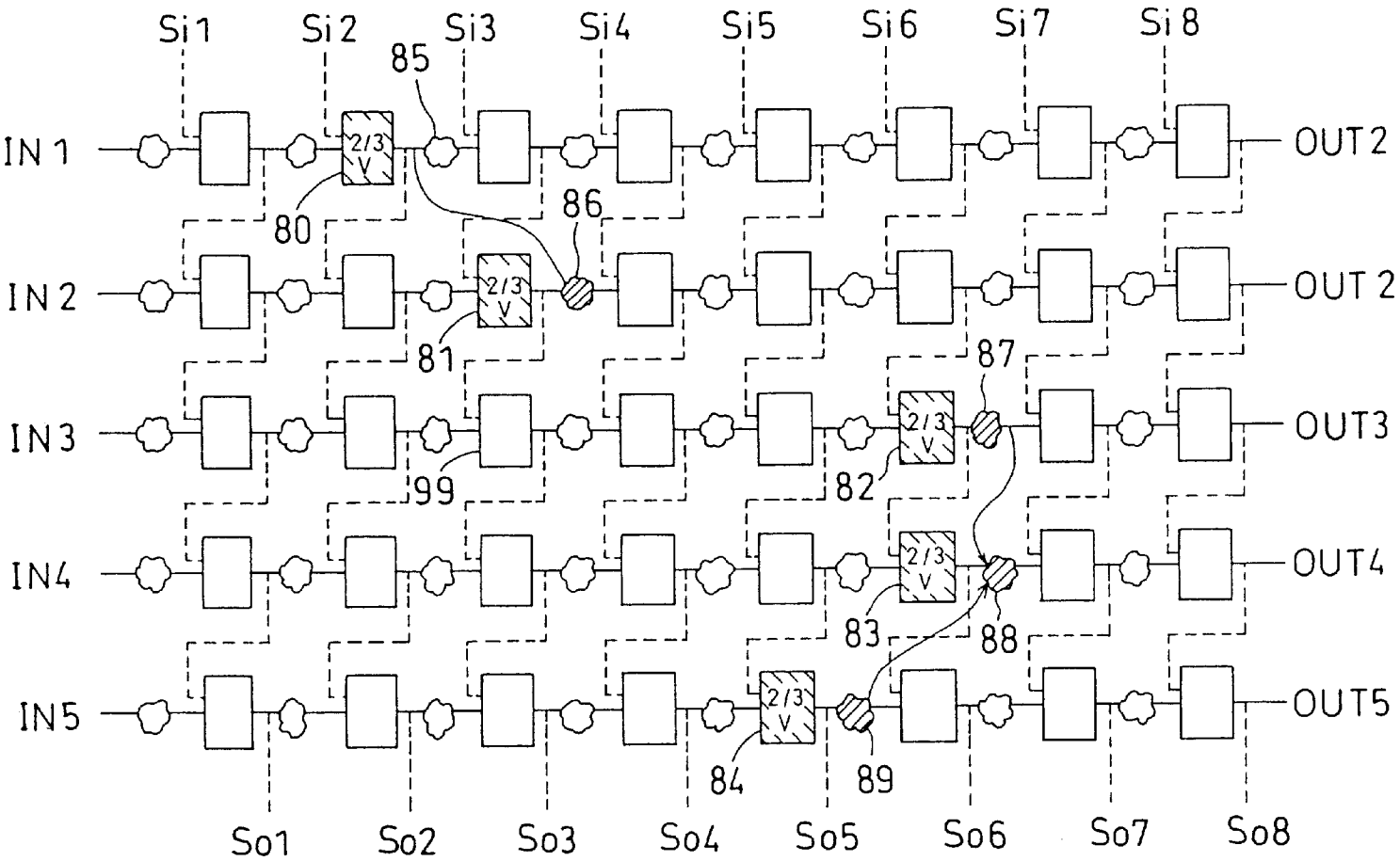
FIG. 18 shows a targeted semiconductor integrated circuit.

FIG. 18 shows an embodiment of the present invention in which the FIG. 13 logic synthesis method is applied to an SIC different from the FIG. 3 SIC.

FIG. 18 illustrates an SIC that employs as a register a flip-flop for scan testing. 80, 81, 82, 83, and 84 are 2 V/3 V scan flip-flops, and other scan flip-flops are 2 V scan flip-flops.

Figure 19:
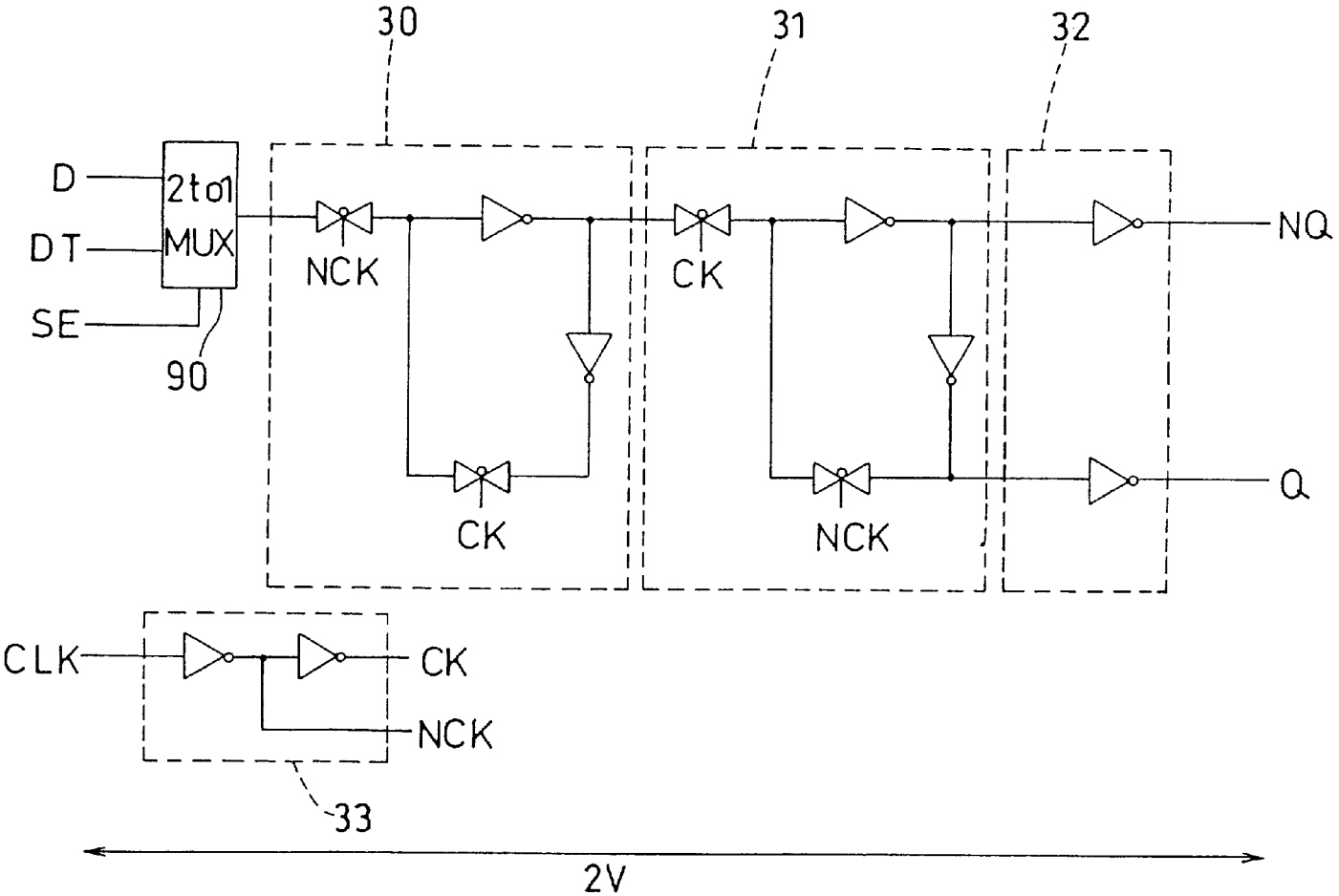
FIG. 19 shows a scan flip-flop without a level converter.

FIG. 19 shows the structure of the 2 V scan flip-flop. In addition to the components of the FIG. 4 flip-flop, the flip-flop of the FIG. 19 further has a multiplexer 90. The multiplexer 90 receives its drive power from the low-voltage source 16, selects between data D or data DT according to a control signal SE, and outputs a selection. The data D or the data DT, whichever is selected, is inputted to the master latch 30. With regard to the same components as the FIG. 4 flip-flop, the same reference numbers are assigned.

Figure 21:
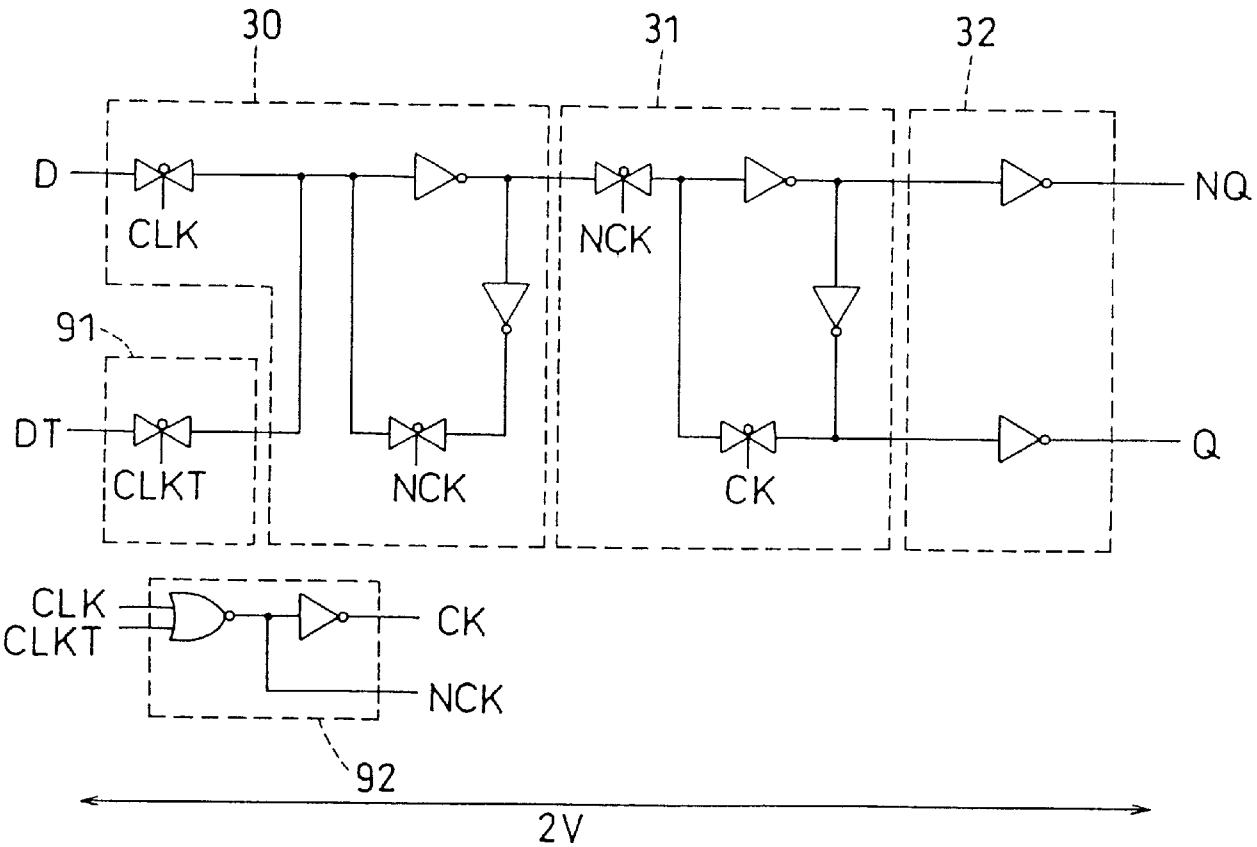
FIG. 21 shows another scan flip-flop without a level converter.

FIG. 21 shows another 2 V scan flip-flop. In addition to the components of the FIG. 4 flip-flop, the flip-flop of the FIG. 21 further has a data input selector 91. The data input selector 91 inhibits the data DT from being inputted when the master latch 30 inputs the data D by an external clock CLK. The data input selector 91 inputs the data DT by another clock CLKT when the master latch 30 inhibits the data D from being inputted. 92 is an internal clock generator that receives the external clock CLK and the clock CLKT thereby generating two types of clocks, i.e., internal clocks CK and NCK. These generated internal clocks CK and NCK are applied to the master latch 30 and to the slave latch 31.

Figure 20:
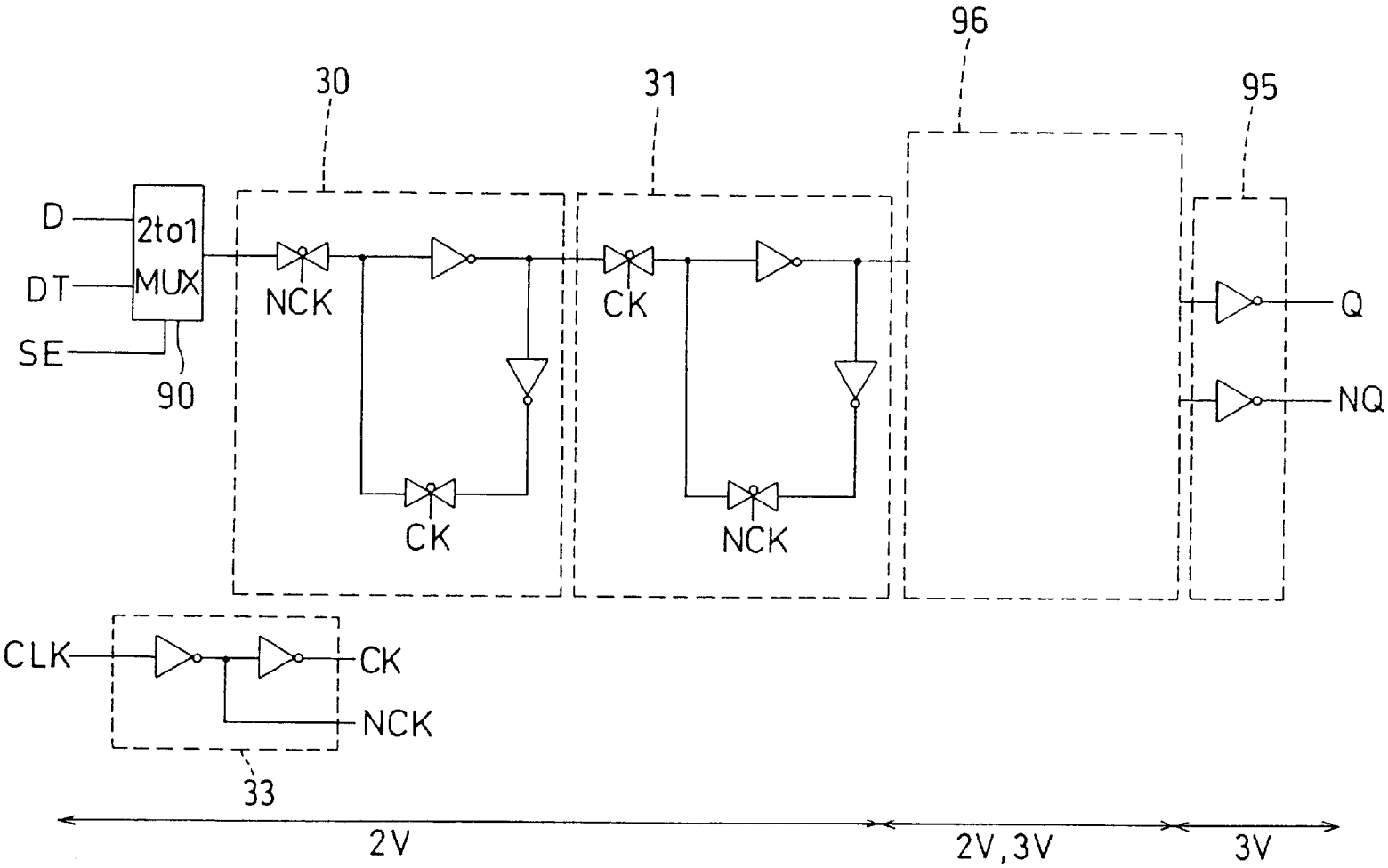
FIG. 20 shows a scan flip-flop with a level converter.

FIG. 20 shows a 2 V/3 V scan flip-flop. In addition to the master latch 30, the slave latch 31, the internal clock generator 33, and the multiplexer 90 of the FIG. 19 2 V scan flip-flop, the FIG. 20 2 V/3 V scan flip-flop further includes a 3 V output buffer 95 and a 2 V/3 V level converter 96. The 2 V/3 V level converter 96 is connected between the slave latch 31 and the output buffer 95. The structure of the 2 V/3 V level converter 96 is the same as the one shown in FIG. 6a or FIG. 6b.

Figure 22:
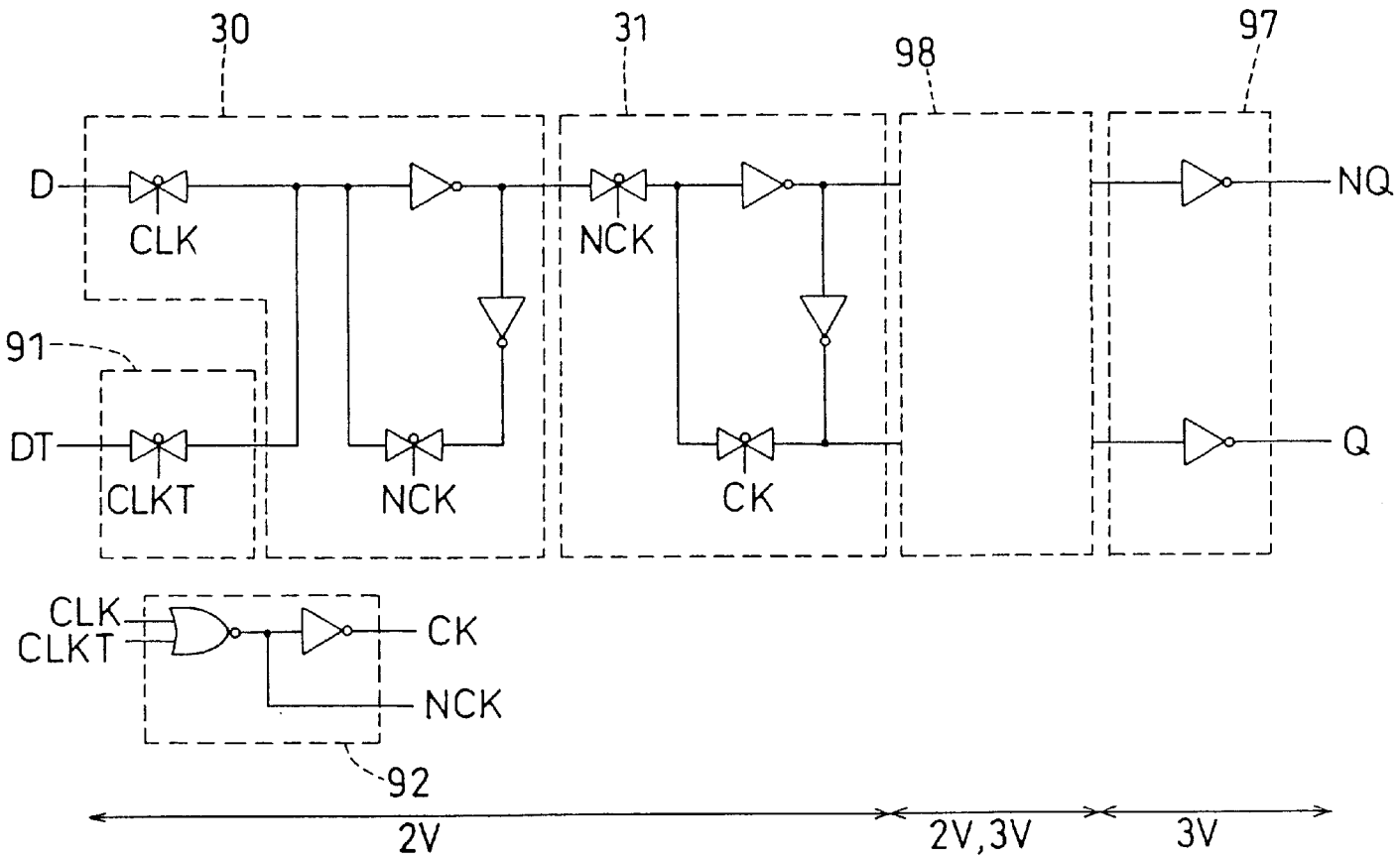
FIG. 22 shows still another scan flip-flop with a level converter.

FIG. 22 shows another 2 V/3 V scan flip-flop. In addition to the master latch 30, the slave latch 31, the internal clock generator 92, and the data input selector 91 of the FIG. 21 2 V scan flip-flop, the FIG. 22 2 V/3 V scan flip-flop further has a 3 V output buffer 97 and a 2 V/3 V level converter 98. The 2 V/3 V level converter 98 is connected between the slave latch 31 and the output buffer 97. The structure of the 2 V/3 V level converter 98 is the same as the one shown in FIG. 6a or FIG. 6b.

A way of generating the FIG. 18 SIC by means of logic synthesis will now be described below. Suppose that the combinational logic circuits 86, 87, and 88 each have a critical path. According to the FIG. 13, the combinational logic circuits 86, 87, and 88 are mapped into 3Vlib combinational logic circuits (i.e., the second-type combinational logic circuit) at the first procedure, and the other combinational logic circuits are mapped into 2Vlib combinational logic circuits (i.e., the first-type combinational logic circuit).

Next, at the second procedure (i.e., the combinational logic circuit remapping procedure), the combinational logic circuit 89 is remapped into a 3Vlib combinational logic circuit. Then, at the third procedure (i.e., the register (flip-flop) mapping procedure), the flip-flops 80, 81, 82, 83, and 84 are mapped into 2 V/3 V flip-flops while on the other hand the other flip-flops are mapped into 2 V flip-flops.

In the FIG. 18 SIC thus generated, the low-voltage (2 V) logic lib and the high-voltage (3 V) logic lib are present as a mixture. Each combinational logic circuit is driven by the low-voltage source or by the high-voltage source, and the level conversion from low to high voltage is performed by the level converter within the 2 V/3 V scan flip-flop.

The FIG. 18 SIC has eight scan chains as shown in the figure by broken line so that the transmission of signals is made not via the combinational logic circuits but only via plural scan flip-flops in the scan test mode. For example, in a scan chain associated with an input Si3, the 2 V/3 V scan flip-flop 81 performs a level conversion from 2 V to 3 V in the normal mode, and the next-stage scan flip-flop 99 performs a level conversion from 3 V to 2 V. Therefore, even when employing the FIG. 20 or FIG. 22 scan flip-flop, it is possible to perform scan testing on the SIC of the present invention in which the 2 V circuit and the 3 V circuit are present as a mixture, even in the scan test mode in which signals takes a different route, i.e., a route passing through a scan chain.

The present invention has been described in terms of the functional block A. The present invention may be applied to the remaining functional blocks, i.e., the functional blocks B–D. The present invention may be applicable between the functional blocks A–D.

In accordance with the logic synthesis of the present invention, each combinational logic circuit with a critical path is designed in such a way as to receive drive power from the 3 V high-voltage source, and a level converter is arranged within a register provided upstream of such a critical-path-contained combinational logic circuit. This eliminates the need for individually determining where to place a level converter within a combinational logic circuit with a critical path when driving a critical path by the high-voltage source. Additionally, the number of level converters required can be reduced, therefore facilitating the SIC design work. Further, although each combinational logic circuit with a critical path is driven by power from the high-voltage source 15, the number of combinational logic circuits with a critical path is low in comparison with the total number of combinational logic circuits contained in the SIC. Therefore, the increase in power consumption is controlled, and the remaining combinational logic circuits without a critical path are driven by power from the low-voltage source 16, whereupon the entire SIC consumes less power. Low power SICs can be realized.

Figure 25:
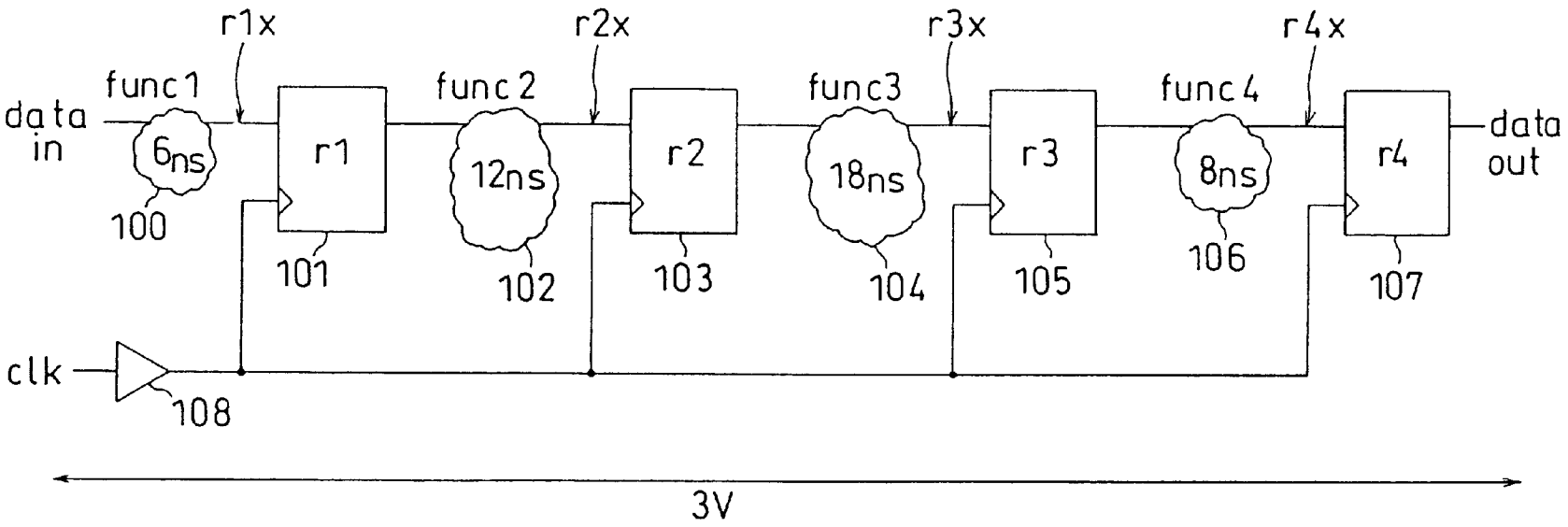
FIG. 25 is a diagram showing a conventional logic circuit.
Figure 26:
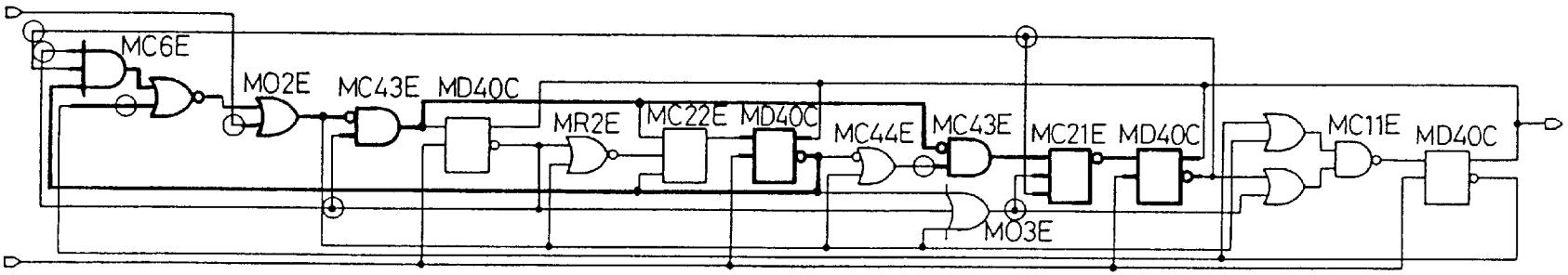
FIG. 26 is a diagram showing the placement of level converters when driving only a critical path in an arbitrary semiconductor integrated circuit by a high-voltage source.
Figure 27:
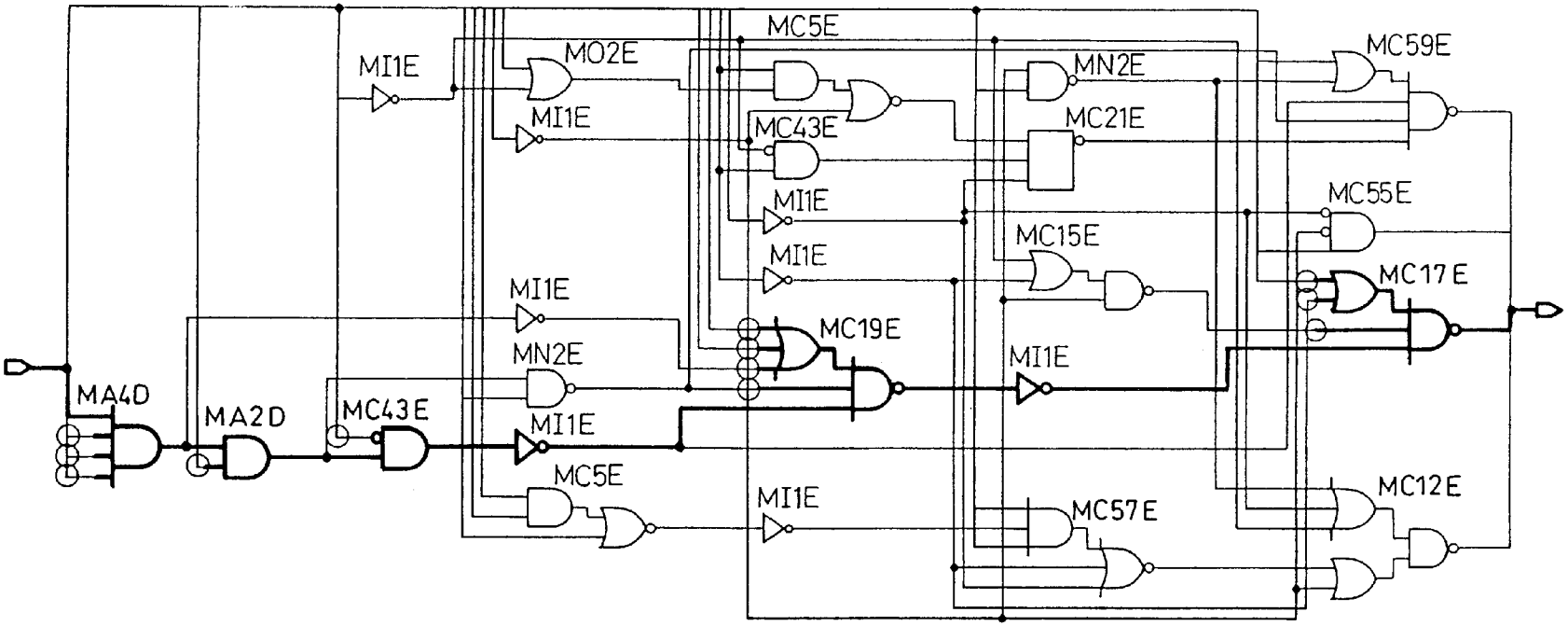
FIG. 27 is a diagram showing the placement of level converters when driving only a critical path in another arbitrary semiconductor integrated circuit by a high-voltage source.

The FIG. 3 SIC of the present invention is compared with the FIG. 25 SIC of the prior art. In the conventional SIC, the combinational logic circuits 100, 102, 104, and 106 have signal propagation delay times, i.e., 6 ns, 12 ns, 18 ns, and 8 ns, respectively. Delay from the time a clock is inputted to a flip-flop to the time data is outputted from the flip-flop is 2 ns and the combinational logic circuit 104 has the maximum delay time of 18 ns, so that the maximum operating frequency of the FIG. 25 SIC is:

$$1000/(2+18)=50 \text{ MHz}.$$

In the FIG. 3 SIC of the present invention, the combinational logic circuit 5 with a critical path has a delay time of 18 ns because it receives its drive power from the high-voltage source 15. The delay times of the combinational logic circuits 1, 3, and 7 increase with the delay of the logic cell because of the level conversion from 3 V into 2 V. Additionally, in the FIG. 3 SIC, the design delay upper limit is set at 20 ns. It is supposed that in the case of the low-voltage (2 V) source the cell delay time becomes 1.5 times longer than the high-voltage (3 V) source. The maximum of the delay times of the combinational logic circuits 1, 3, and 7 without a critical path is less than or equal to the delay time of the combinational logic circuit 5 with a critical path (i.e., 18 ns).

In the present invention, two power sources, i.e., the low-voltage source 16 and the high-voltage source 15, are provided. The combinational logic circuit 3 without a critical path and the combinational logic circuit 5 with a critical path each have a signal propagation delay time of 18 ns, and delay from the time each flip-flop 2 and 4 receives a clock to the time each flip-flop 2 and 4 outputs data is 2 ns. Therefore, the maximum operating frequency of the SIC of the present embodiment is:

$$1000/(2+18): 50 \text{ MHz}.$$

The same maximum operating frequency as accomplished by the conventional SIC can be obtained even when the combinational logic circuits 3 and 5 are driven by the low-voltage source 16.

Figure 23:
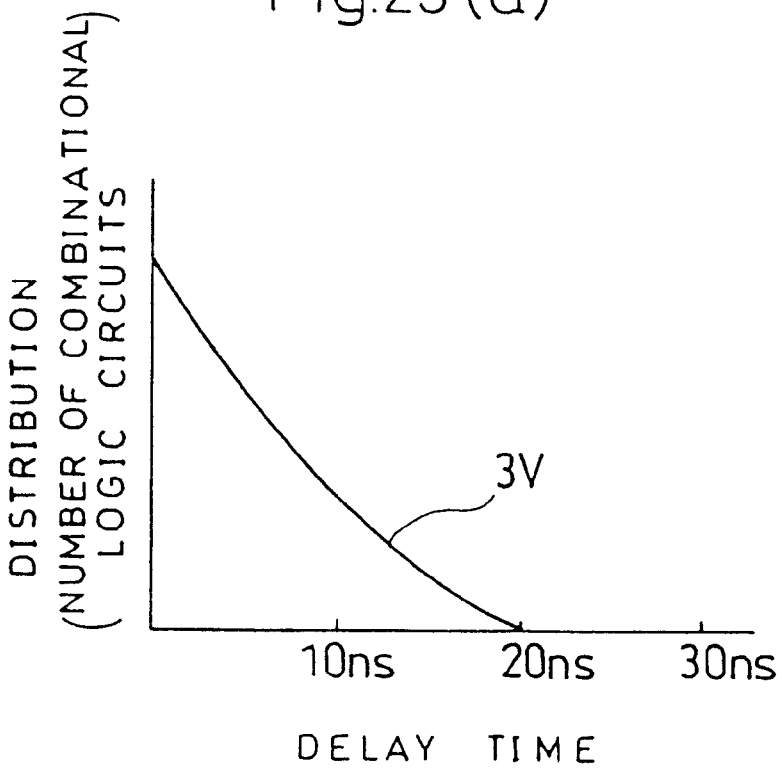
FIG. 23a shows the relationship of the signal propagation delay time versus the distribution of combinational logic circuits, in the prior art technique.
FIG. 23b shows the relationship of the signal propagation delay time versus the distribution of combinational logic circuits, in the present invention.
Figure 23:
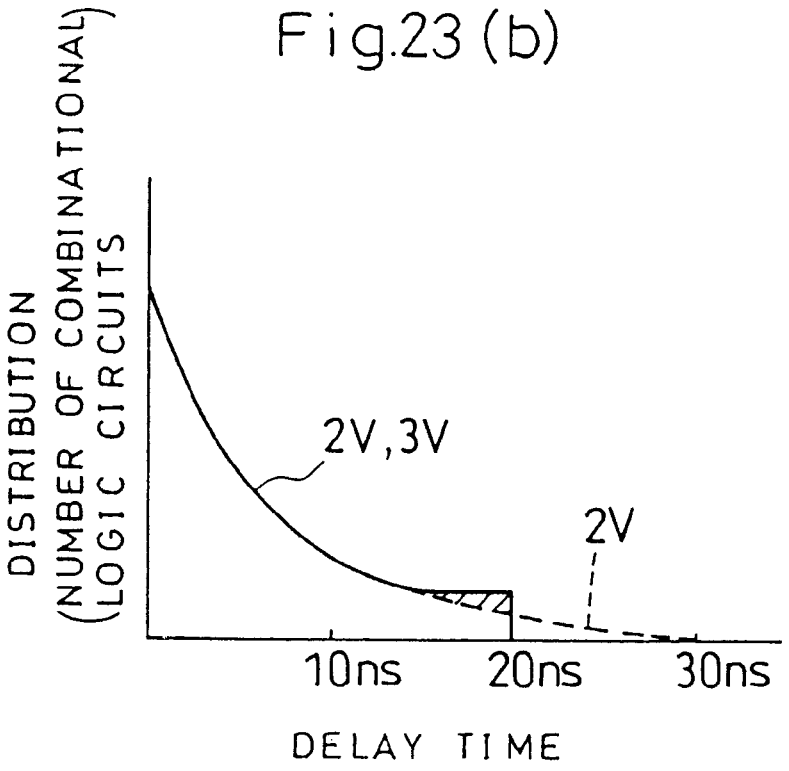

FIG. 23 shows delay from the time a flip-flop receives a clock to the time the next-stage flip-flop inputs data. More specifically, FIG. 23 shows the distribution of signal propagation delays found by summing delay times of a register and a combinational logic circuit. FIG. 23a is for the conventional 3 V. FIG. 23b is for the 2 V/3 V SIC of the present invention. If the supply voltage is changed from 3 V down to 2 V in the conventional SIC, this causes the maximum delay time to increase from 20 ns to 30 ns and the delay time of the critical path exceeds the design delay upper limit of 20 ns. Conversely, in the SIC of the present invention, it is so designed that only combinational logic circuits containing therein a critical path receive their drive power from the high-voltage source 15 and the other combinational logic circuits containing no critical path receive drive power from the low-voltage source 16. As a result of such arrangement, the delay time of the critical path does not exceed the design delay upper limit of 20 ns (see FIG. 23b).

Next, the conventional SIC and the present invention SIC are compared in power consumption. If the power consumption of the conventional SIC is P, a low- and high-voltage source (2 V and 3 V) are employed, the ratio of the critical path to the entire circuit is 10%, and an incremental power consumption due to a difference in circuit structure between the 2 V/3 V flip-flop of the present invention and the conventional flip-flop is 10%, then the power consumption of the SIC of the present invention is found by:

$$[P\times(2/3)]^2\times0.9+P\times1.1\times0.1=P\times0.51.$$

The present SIC consumes 49 percent less power than the conventional SIC.

If the ratio of the critical path to the entire circuit is 5%, then the power consumption of the SIC of the present invention is found by:

$$[P\times(2/3)]^2\times0.95+P\times1.1\times0.05=P\times0.48.$$

The present SIC consumes 52 percent less power than the conventional SIC.

Finally, the conventional SIC and the present invention SIC are compared in circuit size. If the circuit size of the conventional SIC is S, the ratio of the flip-flop to the entire SIC is 20%, the ratio of the critical path to the entire SIC is 10%, and an incremental area due to a difference in circuit structure between the 2 V/3 V flip-flop of the present invention and the conventional flip-flop is 10%, then the circuit size of the SIC of the present invention is found by:

$$S\times0.8+S\times0.18+S\times1.1\times0.02=S\times1.002.$$

The present SIC increases in size only by 0.2%.

If the ratio of the critical path to the entire circuit is 5%, then the circuit size of the SIC of the present invention is found by:

$$S\times0.8+S\times0.19+S\times1.1\times0.01=S\times1.001.$$

In this case, the present SIC increases in size only by 0.1%.

The invention claimed is:

[1. A logic synthesis method for synthesizing, based on connection information of logic cells, a semiconductor integrated circuit of a plurality of registers and a plurality of combinational logic circuits connected between said registers, said logic synthesis method comprising:

a first step for mapping, when there exists among said plural combinational logic circuits a combinational logic circuit with a signal propagation delay time below a design delay upper limit, such a combinational logic circuit into a combinational logic circuit of a first type driven by a low-voltage source, and for mapping, when there exists among said plural combinational logic circuits a combinational logic circuit with a signal propagation delay time above the design delay upper limit, such a combinational logic circuit into a combinational logic circuit of a second type driven by a high-voltage source;

a second step for determining which of said combinational logic circuits of the first type outputs to a combinational logic circuit of the second type and for remapping a combinational logic circuit of the first type, determined to output to a combinational logic circuit of the second type, into the second-type; and a third step for determining which of said registers generates a signal to a combinational logic circuit of the second type, for mapping a register, determined to generate a signal to a combinational logic circuit of the second type, into a register driven by the high-voltage source, and for mapping a register, determined not to generate a signal to a combinational logic circuit of the second type, into a register driven by the low-voltage source.]

[2. A logic synthesis method according to claim 1, wherein said first step comprises:

evaluating a sum of a signal propagation delay time of a combinational logic circuit and a signal propagation delay time of a register driven by the low-voltage source; and mapping, when there exists a combinational logic circuit with respect to which said evaluation step yields a result below the design delay upper limit, such a combinational logic circuit into the first type, and mapping, when there exists a combinational logic circuit with respect to which said evaluation step yields a result above the design delay upper limit, such a combinational logic circuit into the second type.]

[3. A logic synthesis method according to claim 1 wherein said first step comprises:

mapping each said combinational logic circuit into the first-type;

determining which of said combinational logic circuits has a signal propagation delay time above the design delay upper limit, and mapping a combinational logic circuit of the first type, determined to have a signal propagation delay time above the design delay upper limit, into the second type.]

[4. A logic synthesis method according to claim 1 wherein said second step comprises:

determining whether said first-to-second type remapping creates a layout in which a combinational logic circuit of the first type gives its output to a combinational logic circuit of the second type, and repeatedly remapping, if there still exists a combinational logic circuit of the first type that outputs to a combinational logic circuit of the second type, such a combinational logic circuit of the first type into the second type.]

[5. A logic synthesis method according to claim 1 wherein register-transfer-level design data describing a plurality of registers and a plurality of combinational logic circuits connected between said registers is input, and said logic cell connection information of said first step is generated from said input register-transfer-level design data.]

[6. A logic synthesis method according to claim wherein a net list describing logic cell connection information is input, and said logic cell connection information of said first step is generated from said input cell connection information.]

[7. A logic synthesis method according to claim 1 wherein a schematic describing logic cell connection information is input, and said logic cell connection information of said first step is generated from said input logic cell connection information.]

[8. A logic synthesis method according to any of claims 5–7 wherein said logic cell connection information based on said register-transfer-level design data, on said net list, or on said schematic is optimized, and said optimized logic cell connection information serves as said logic cell connection information of said first step.]

[9. A logic synthesis method according to any of claims 1–4 further including a step after said third step for verifying each timing of said registers.]

[10. A semiconductor integrated circuit having a plurality of registers and a plurality of combinational logic circuits connected between said registers wherein:

part of said plural combinational logic circuits are formed by respective combinational logic circuits of a first type driven by a low-voltage source and the remaining part of said plural combinational logic circuits are formed by respective combinational logic circuits of a second type driven by a high-voltage source; and of said plural registers a register that has a combinational logic circuit of the first type on its input side and a combinational logic circuit of the second type on its output side is a circuit that has a temporary data storage driven by the low-voltage source and a level converter which is driven by the high-voltage source and which converts a low-voltage-level output signal, received from said temporary data storage, into a high-voltage-level output.]

[11. A semiconductor integrated circuit according to claim 10 wherein:

of said plural registers a register that has combinational logic circuits of the first type on its input and output sides and a register that has a combinational logic circuit of the second type on its input side and a combinational logic circuit of the first type on its output side are circuits which are driven by the low-voltage source and which do not contain said level converter; and of said plural registers a register than has combinational logic circuits of the second type on its input and output sides is a circuit which is driven by the high-voltage source and which contains said level converter for converting a low-voltage-level output signal, received from said temporary data storage, into a high-voltage-level output.]

[12. A semiconductor integrated circuit according to either claim 10 or claim 11 further including a clock feed means which is driven by the low-voltage source and which feeds a clock to each said register.]

[13. A semiconductor integrated circuit according to claim 10 wherein:

of said plural registers a register containing said level converter is formed by a flip-flop;

said flip-flop including:

a master latch and a slave latch which are driven by the low-voltage source and which are connected in series;

an output buffer which is driven by the high-voltage source; and a level converter which is connected between said slave latch and said output buffer and which converts a low-voltage-level signal, received from said slave latch, into a high-voltage signal, to provide same to said output buffer.]

[14. A semiconductor integrated circuit according to claim 11 wherein:

of said plural registers a register not containing said level converter is formed by a flip-flop;

said flip-flop including:

a master latch and a slave latch which are driven by the low-voltage source and which are connected in series; and an output buffer which is driven by the low-voltage source and which receives an output signal of said slave latch.]

[15. A semiconductor integrated circuit according to claim 10 wherein:

of said plural registers a register containing said level converter is formed by a latch;

said latch including:

a latch section which is driven by the low-voltage source;

an output buffer which is driven by the high-voltage source; and a level converter which is connected between said latch section and said output buffer and which converts a low-voltage-level signal, received from said latch section, into a high-voltage signal, to provide same to said output buffer.]

[16. A semiconductor integrated circuit according to claim 11 wherein:

of said plural registers a register not containing said level converter is formed by a latch;

said latch including:

a latch section which is driven by the low-voltage source; and an output buffer which is driven by the low-voltage source and which receives an output signal of said latch section.]

[17. A semiconductor integrated circuit according to any of claims 10 and 11 wherein said plural registers are formed by respective flip-flops for scan testing.]

[18. A semiconductor integrated circuit according to claim 17 wherein of said scan testing flip-flops a scan testing flip-flop that contains said level converter includes:

a multiplexer which is driven by the low-voltage source and which selects one of a plurality of input data items according to an external control signal;

a master latch and a slave latch which are driven by the low-voltage source, which receive signals from said multiplexer, and which are connected in series;

an output buffer which is driven by the high-voltage source; and a level converter which is connected between said slave latch and said output buffer and which converts a low-voltage-level signal, received from said slave latch, into a high-voltage signal, to provide same to said output buffer.]

[19. A semiconductor integrated circuit according to claim 17 wherein of said scan testing flip-flops a scan testing flip-flop that contains said level converter includes:

a data input selector which is driven by the low-voltage source and which selects one of a plurality of input data items according to a clock signal;

a master latch and a slave latch which are driven by the low-voltage source, which receive signals from said data input selector, and which are connected in series;

an output buffer which is driven by the high-voltage source; and a level converter which is connected between said slave latch and said output buffer and which converts a low-voltage-level signal, received from said slave latch, into a high-voltage signal, to provide same to said output buffer.]

[20. A semiconductor integrated circuit according to any of claims 13, 15, 18, and 19 wherein:

said level converter is formed by two PMOS transistors and two NMOS transistors;

one of said two PMOS transistors has a gate and a drain, said gate and said drain respectively being connected with a drain and a gate of the other PMOS transistor, and sources of said two PMOS transistors are connected to the high-voltage source;

one of said two NMOS transistors has a gate at which one of a pair of complementary signals from said slave latch is applied, and the other NMOS transistor has a gate at which the other of said pair of complementary signals is applied, and drains of said two NMOS transistors are connected to the drains of said two PMOS transistors, and sources of said two NMOS transistors are connected to ground; and a potential at each of the drains of said two NMOS transistors is provided in the form of a signal.]

[21. A semiconductor integrated circuit according to any of claims 13, 15, 18, and 19 wherein said level converter includes two PMOS transistors and two CMOS inverters;

each said CMOS inverter being formed by a PMOS transistor and an NMOS transistor connected in series wherein gates of said PMOS and NMOS transistors together serve as an input terminal and an in-series connection between said PMOS transistor and said NMOS transistor serves as an output terminal;

said input terminal of one of said two CMOS inverters being fed one of a pair of complementary signals from said slave latch, and said input terminal of the other CMOS inverter being fed the other of said pair of complementary signals from said slave latch;

said two PMOS transistors having drains connected to sources of said PMOS transistors of said CMOS inverters, and said sources being connected to the high-voltage source;

sources of said NMOS transistors of said two CMOS inverters being connected to ground;

said output terminal of each said CMOS inverter being connected to a gate of a PMOS transistor not connected in series therewith; and a potential at each of said output terminals of said two CMOS inverters being provided in the form of a signal.]

[22. A semiconductor integrated circuit according to any of claims 10 and 11 wherein low and high voltages are provided from outside said semiconductor integrated circuit.]

[23. A semiconductor integrated circuit according to any of claims 10 and 11 further including an area for input pads, and an internal core section within which a plurality of registers, a plurality of combinational logic circuits, and a memory cell section are arranged.]

*24. A semiconductor integrated circuit comprising:*

*a first logic gate driven by a low-voltage source;*

*a plurality of second logic gates driven by a high-voltage source; at least one of said plurality of second logic gates having multiple input ports for receiving distinct input signals; and*

*a register adapted to receive a clock input, said register having an input port and an output port, said input port being coupled to said first logic gate and said output port being coupled to said plurality of second logic gates, said plurality of second logic gates forming a critical path,*

*said register having level conversion means which receives and stores a low-voltage output signal from said first logic gate, converts the level of the stored low-voltage output signal into a level of a high-voltage signal and then outputs the high-voltage signal to said plurality of second logic gates.*

*25. The semiconductor integrated circuit of claim 24, wherein said level conversion means comprises a temporary data storage means which utilizes the low-voltage source as a voltage source thereof and a level converter which utilizes the high-voltage source as a voltage source thereof, said level converter operative for converting a level of a low-voltage output signal of the temporary data storage into a level of a high-voltage output signal.*

*26. The semiconductor integrated circuit of claim 24, wherein the first logic gate forms a portion of a first combinational circuit and the plurality of second logic gates form a portion of a second combinational circuit, each of the first and second combinational circuits including one signal propagation path.*

*27. The semiconductor integrated circuit of claim 26, wherein the first combinational circuit does not include any of said plurality of second logic gates.*

*28. The semiconductor integrated circuit of claim 26, wherein the second combinational circuit does not include the first logic gate.*

*29. The semiconductor integrated circuit of claim 26, wherein the first combinational circuit and the second combinational circuit include both the first logic gate and the second logic gates.*

*30. The semiconductor integrated circuit of claim 24, wherein said plurality of second logic gates are coupled in series with one another.*

*31. The semiconductor integrated circuit of claim 24, wherein said plurality of second logic gates are coupled in series with one another with no intervening memory elements disposed therebetween.*

*32. The semiconductor integrated circuit of claim 31, wherein one of said plurality of second logic gates is directly coupled to the output port of said register.*

*33. A semiconductor integrated circuit comprising a plurality of combinational circuits, each of said combinational circuits having one signal propagation path contained within said combinational circuit,*

*said plurality of combinational circuits including a first combinational circuit utilizing a low-voltage source as a voltage source thereof, and a second combinational circuit utilizing a high-voltage source as a voltage source thereof,*

*wherein, the signal propagation paths contained in said second combinational circuit and a predetermined combinational circuit other than said first and second combinational circuits, share a portion, so that said second combinational circuit and said predetermined combinational circuit have at least one logic gate in common, said second combinational circuit and predetermined combinational circuit each providing a separate input to said common logic gate,*

*each of said predetermined combinational circuit and said second combinational circuit includes at least one logic gate other than said common logic gate, which is disposed on a portion of the signal propagation path other than said portion shared by the signal propagation paths of said predetermined combinational circuit and said second combinational circuit, and*

*at least said common logic gate and said portion shared by the signal propagation paths of said predetermined and second combinational circuits are driven by the high-voltage source.*

*34. The semiconductor integrated circuit of claim 33, wherein, in the predetermined combinational circuit, a part of the signal propagation path other than the common logic gate and which is a path located posterior to the common logic gate, is driven by the high-voltage source.*

*35. The semiconductor integrated circuit of claim 34, wherein, in the predetermined combinational circuit, a part of the signal propagation path other than the common logic gate and which is a path located anterior to the common logic gate, is driven by the low-voltage source.*

* * * * *